US012672330B2

(12) United States Patent
Cheng et al.

(10) Patent No.: US 12,672,330 B2
(45) Date of Patent: Jun. 30, 2026

(54) EPITAXIAL FEATURES IN SEMICONDUCTOR DEVICES AND MANUFACTURING METHOD THEREOF

(71) Applicant: Taiwan Semiconductor Manufacturing Company, Ltd., Hsin-Chu (TW)

(72) Inventors: Chun-Fai Cheng, Hong Kong (TW); Chang-Miao Liu, Hsinchu City (TW); Ming-Lung Cheng, Kaohsiung County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 516 days.

(21) Appl. No.: 18/181,173

(22) Filed: Mar. 9, 2023

(65) Prior Publication Data

US 2023/0378320 A1 Nov. 23, 2023

Related U.S. Application Data

(60) Provisional application No. 63/382,250, filed on Nov. 3, 2022, provisional application No. 63/342,726, filed on May 17, 2022.

(51) Int. Cl.
*H10D 64/01* (2025.01)
*H10D 30/01* (2025.01)
(Continued)

(52) U.S. Cl.
CPC ......... *H10D 64/017* (2025.01); *H10D 30/014* (2025.01); *H10D 30/43* (2025.01);
(Continued)

(58) Field of Classification Search
CPC .......................... H10D 64/017; H10D 84/017
See application file for complete search history.

(56) References Cited

U.S. PATENT DOCUMENTS 8,772,109 B2 7/2014 Colinge
8,785,285 B2 7/2014 Tsai et al.
(Continued)

FOREIGN PATENT DOCUMENTS

TW 202129721 A 8/2021
TW 202145360 A 12/2021
(Continued)

*Primary Examiner* — Brian Turner
(74) *Attorney, Agent, or Firm* — HAYNES AND BOONE, LLP

(57) ABSTRACT

A method includes forming a semiconductor fin protruding from a substrate, forming a dummy gate structure across the semiconductor fin, recessing the semiconductor fin in a region adjacent the dummy gate structure to form a recess, growing an epitaxial feature in the recess to fully covers an end of the semiconductor fin that is otherwise exposed in the recess, trimming the epitaxial feature to reduce a width of the epitaxial feature to expose again a portion of the end of the semiconductor fin in the recess, depositing a dielectric layer on the epitaxial feature and in physical contact with the exposed portion of the end of the semiconductor fin, and replacing the dummy gate structure with a metal gate structure.

20 Claims, 23 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 84/01* | (2026.01) |
| *H10D 84/03* | (2025.01) |
| *H10D 84/85* | (2025.01) |

(52) U.S. Cl.
CPC ..... *H10D 30/6735* (2025.01); *H10D 30/6757* (2025.01); *H10D 62/121* (2025.01); *H10D 84/017* (2025.01); *H10D 84/0188* (2025.01); *H10D 84/0193* (2025.01); *H10D 84/038* (2025.01); *H10D 84/853* (2025.01)

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2016/0148933 A1* | 5/2016 | Cheng | H10D 30/797 257/369 |
| 2020/0135903 A1* | 4/2020 | Lee | H10D 84/038 |
| 2020/0135932 A1* | 4/2020 | Wang | H10D 64/021 |
| 2020/0168742 A1* | 5/2020 | Wang | H01L 21/02532 |

FOREIGN PATENT DOCUMENTS

| | | |
|---|---|---|
| TW | 202147414 A | 12/2021 |
| TW | 202211377 A | 3/2022 |

* cited by examiner

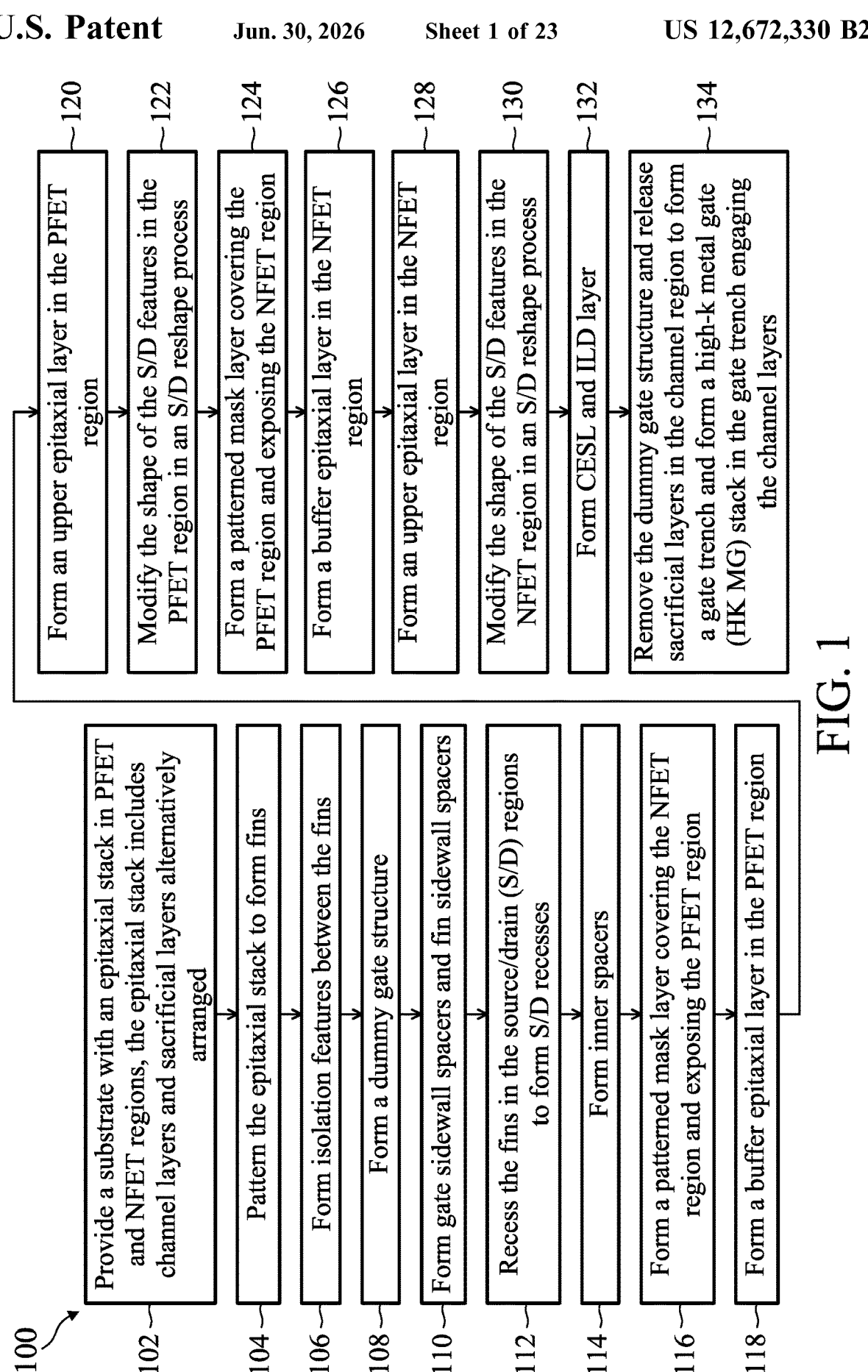

102 — Provide a substrate with an epitaxial stack in PFET and NFET regions, the epitaxial stack includes channel layers and sacrificial layers alternatively arranged 104 — Pattern the epitaxial stack to form fins 106 — Form isolation features between the fins 108 — Form a dummy gate structure 110 — Form gate sidewall spacers and fin sidewall spacers 112 — Recess the fins in the source/drain (S/D) regions to form S/D recesses 114 — Form inner spacers 116 — Form a patterned mask layer covering the NFET region and exposing the PFET region 118 — Form a buffer epitaxial layer in the PFET region 120 — Form an upper epitaxial layer in the PFET region 122 — Modify the shape of the S/D features in the PFET region in an S/D reshape process 124 — Form a patterned mask layer covering the PFET region and exposing the NFET region 126 — Form a buffer epitaxial layer in the NFET region 128 — Form an upper epitaxial layer in the NFET region 130 — Modify the shape of the S/D features in the NFET region in an S/D reshape process 132 — Form CESL and ILD layer 134 — Remove the dummy gate structure and release sacrificial layers in the channel region to form a gate trench and form a high-k metal gate (HK MG) stack in the gate trench engaging the channel layers

EPITAXIAL FEATURES IN SEMICONDUCTOR DEVICES AND MANUFACTURING METHOD THEREOF

PRIORITY DATA

This application claims priority to U.S. Provisional Patent Application No. 63/342,726 filed on May 17, 2022 and U.S. Provisional Patent Application No. 63/382,250 filed on Nov. 3, 2022, the entire disclosures of which are incorporated herein by reference.

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA devices get their name from the gate structure which can extend around the channel region providing access to the channel on four sides. GAA devices are compatible with conventional complementary metal-oxide-semiconductor (CMOS) processes and their structure allows them to be aggressively scaled while maintaining gate control and mitigating SCEs.

As the semiconductor industry further progresses into sub-10 nanometer (nm) technology process nodes in pursuit of higher device density, higher performance, and lower costs, parasitic capacitance influenced by the volumes of source/drain (S/D) epitaxial features should not be omitted. Particularly in high-speed circuits, such as ring oscillators, S/D epitaxial features with large volumes introduce extra parasitic capacitance, such as between S/D epitaxial features and metal gate stacks. Such parasitic capacitance increases resistance-capacitance (RC) response time of a high-speed circuit and deteriorates circuit performance. With the ever-decreasing spacing between device features, it also becomes difficult to prevent adjacent S/D epitaxial features from merging into one larger epitaxial feature and causing even higher parasitic capacitance. What is more, the large volumes of S/D epitaxial features also deteriorate leakage performance between S/D contacts and metal gate stacks. Therefore, while existing methods of manufacturing multi-gate devices have been satisfactory in many respects, challenges with respect to performance of the resulting device may not be satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 shows a flow chart of a method for forming a multi-gate device, according to one or more aspects of the present disclosure.

DETAILED DESCRIPTION

Figure 2B:
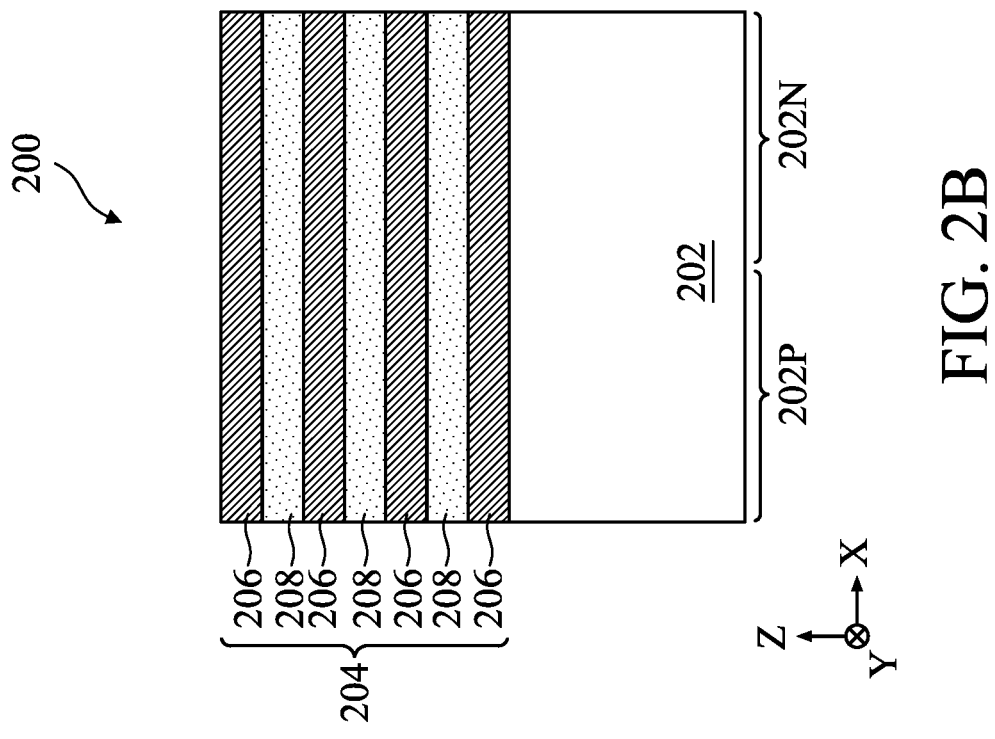
FIGS. 2B, 3B, 4B, 5B, 6B, 7B, 7C, 7D, 8B, 8C, 8D, 9, 10, 11, 12, 13, 14, 15, 16, 17, 18, 19, 20, and 21 illustrate cross-sectional views of a semiconductor structure during a fabrication process according to the method of FIG. 1, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/-10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating multi-gate devices with reshaped source/drain (S/D) epitaxial features in advanced technology nodes. Source/drain epitaxial features, or source/drain features, may refer to a source or a drain, individually or collectively dependent upon the context.

It is noted that multi-gate devices include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding or wrapping around a portion of a channel region). Devices presented herein also include embodiments that have channel regions disposed in nanosheet channel(s), nanowire channel(s), bar-shaped channel(s), and/or other suitable channel configurations. Presented herein are embodiments of devices that may have one or more channel regions (e.g., nanowires/nanosheets) associated with a single, contiguous gate structure. However, one of ordinary skill would recognize that the teaching can apply to a single channel (e.g., single nanowire/nanosheet) or any number of channels. One of ordinary skill may recognize other examples of semiconductor devices that may benefit from aspects of the present disclosure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include reshaping S/D epitaxial features to modify the profile of S/D epitaxial features. By reshaping S/D epitaxial features, the volumes of S/D epitaxial features are reduced, thus less parasitic capacitance. Further, the reshaped profile of S/D epitaxial features enlarges lateral distance between adjacent S/D epitaxial features and prevents adjacent S/D epitaxial features from merging. In other words, process window for forming S/D epitaxial features is enlarged. The reshaped profile of S/D epitaxial features also helps suppressing leakage current between S/D contacts and metal gate stacks and improves device performance.

Illustrated in FIG. 1 is a method 100 of semiconductor fabrication including fabrication of a multi-gate device. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 5B:
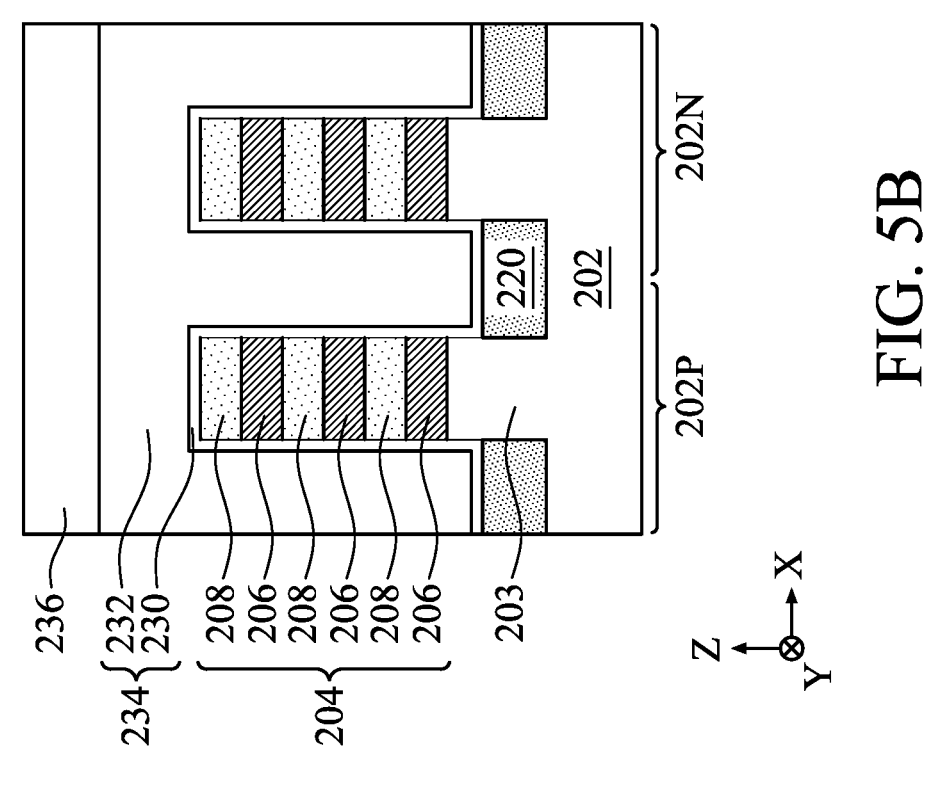
Figure 5A:
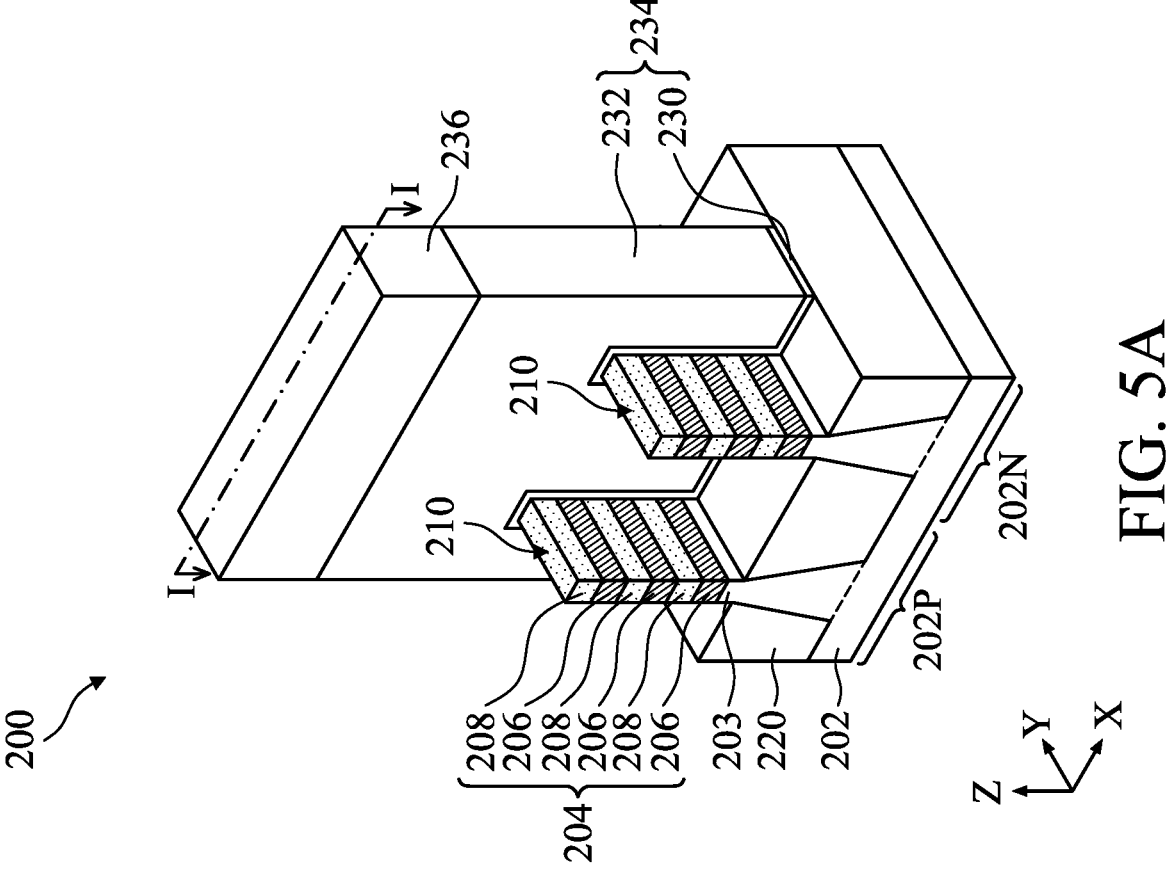
Figure 6B:
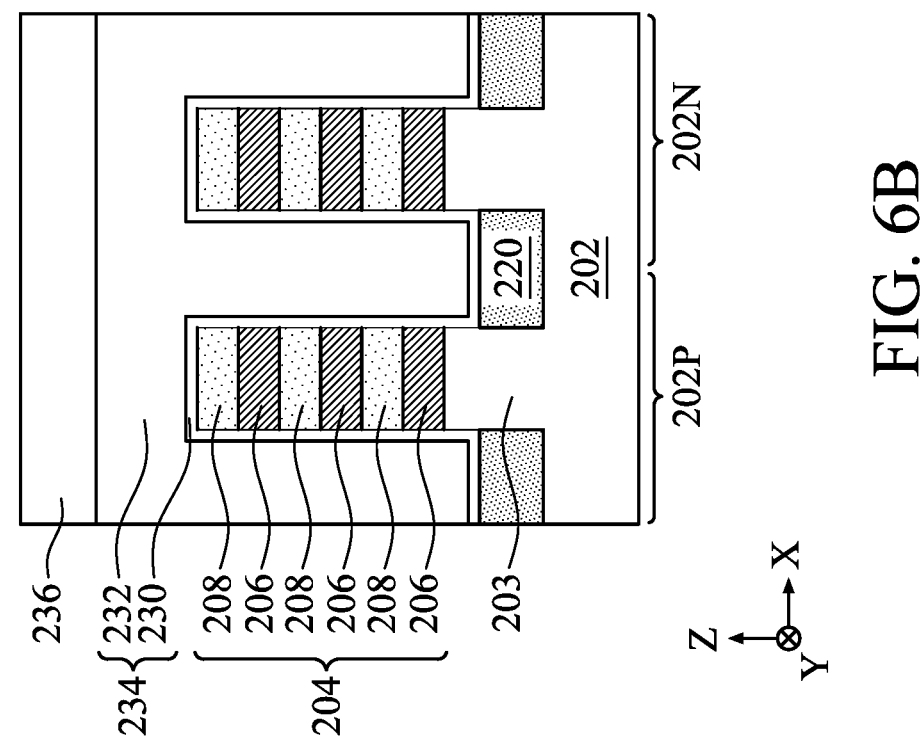
Figure 6A:
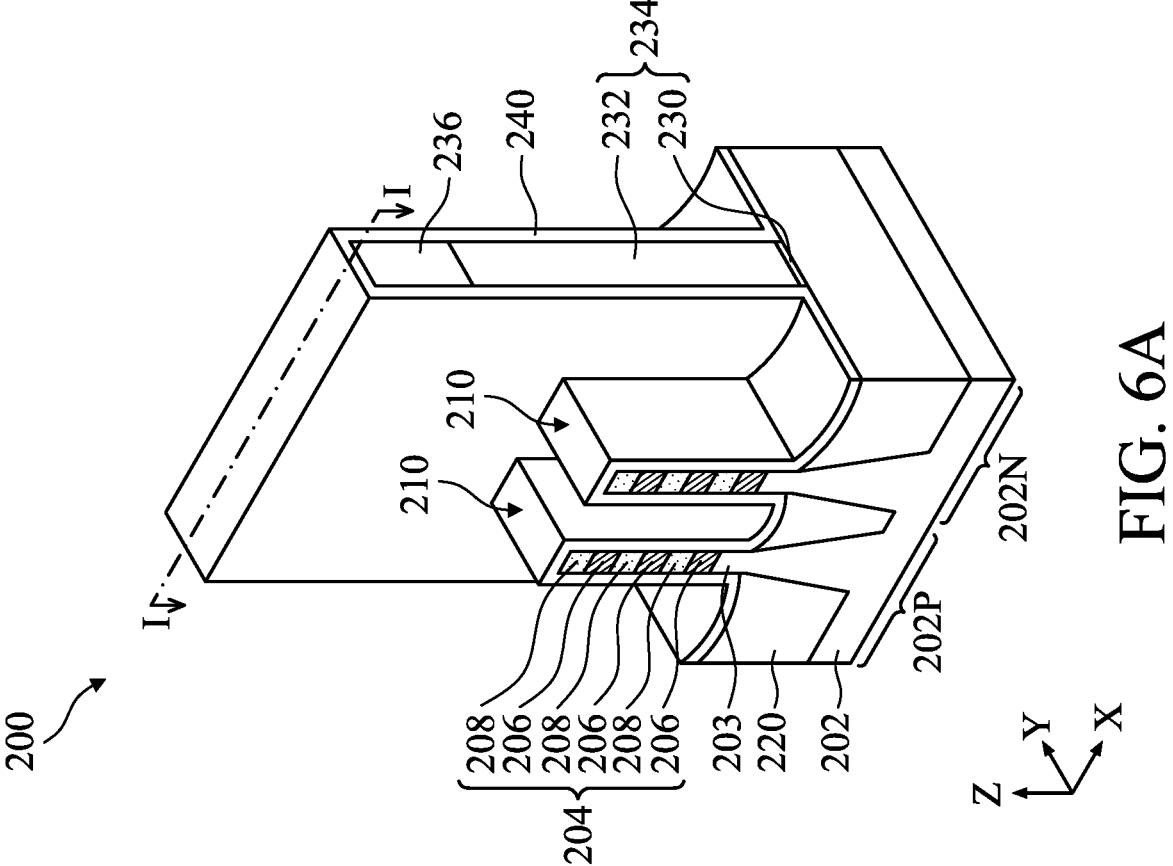
Figure 7B:
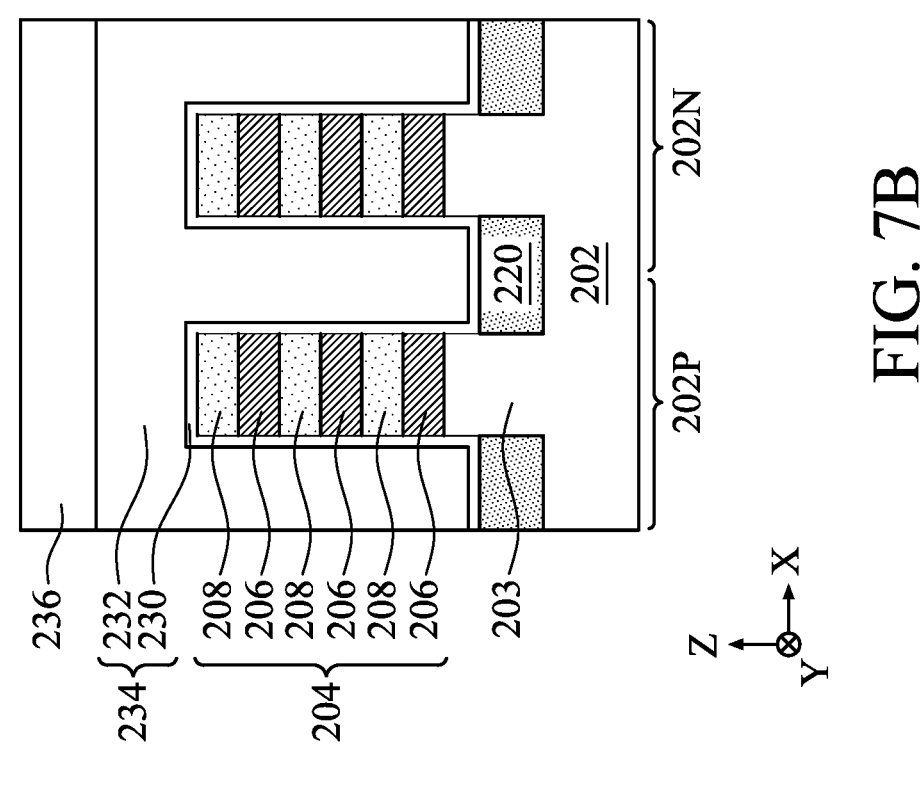
Figure 7A:
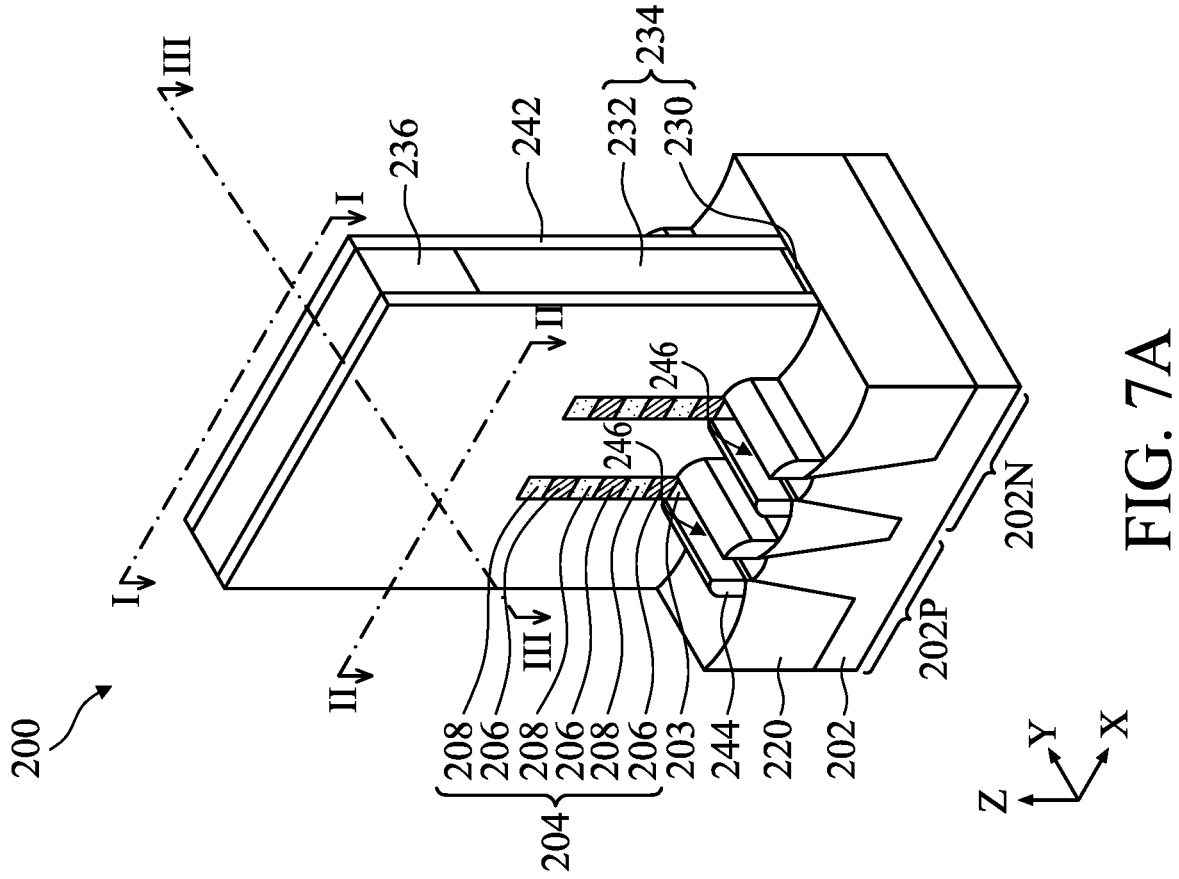
Figure 7D:
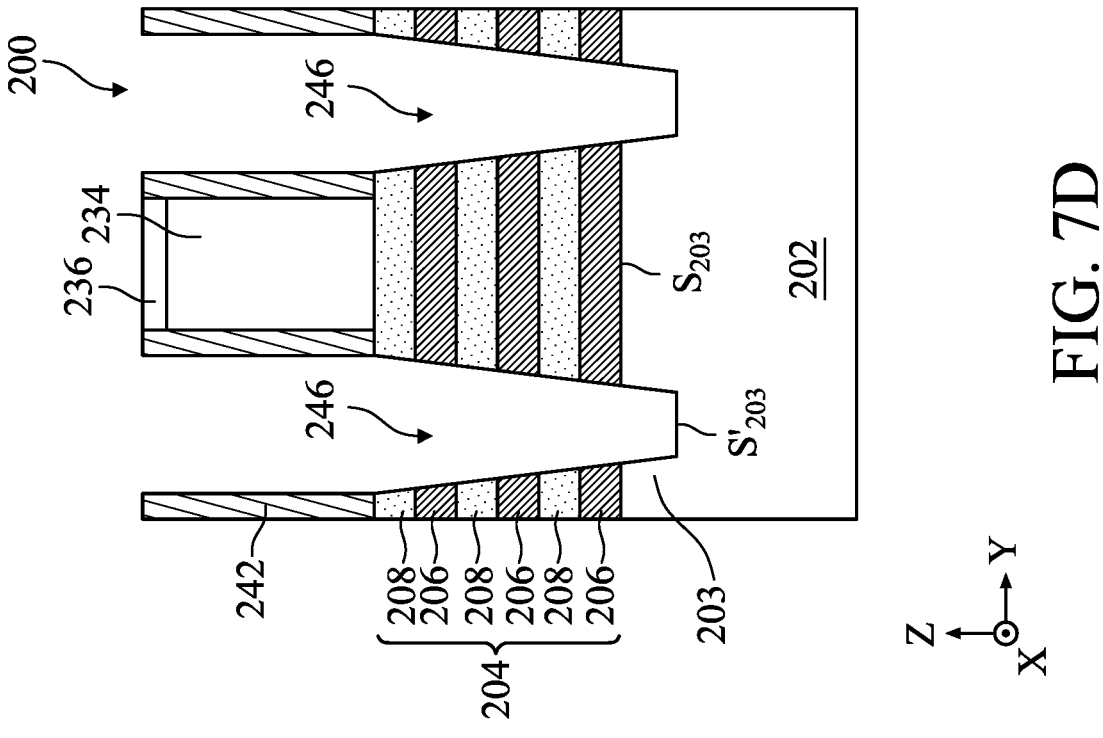
Figure 7C:
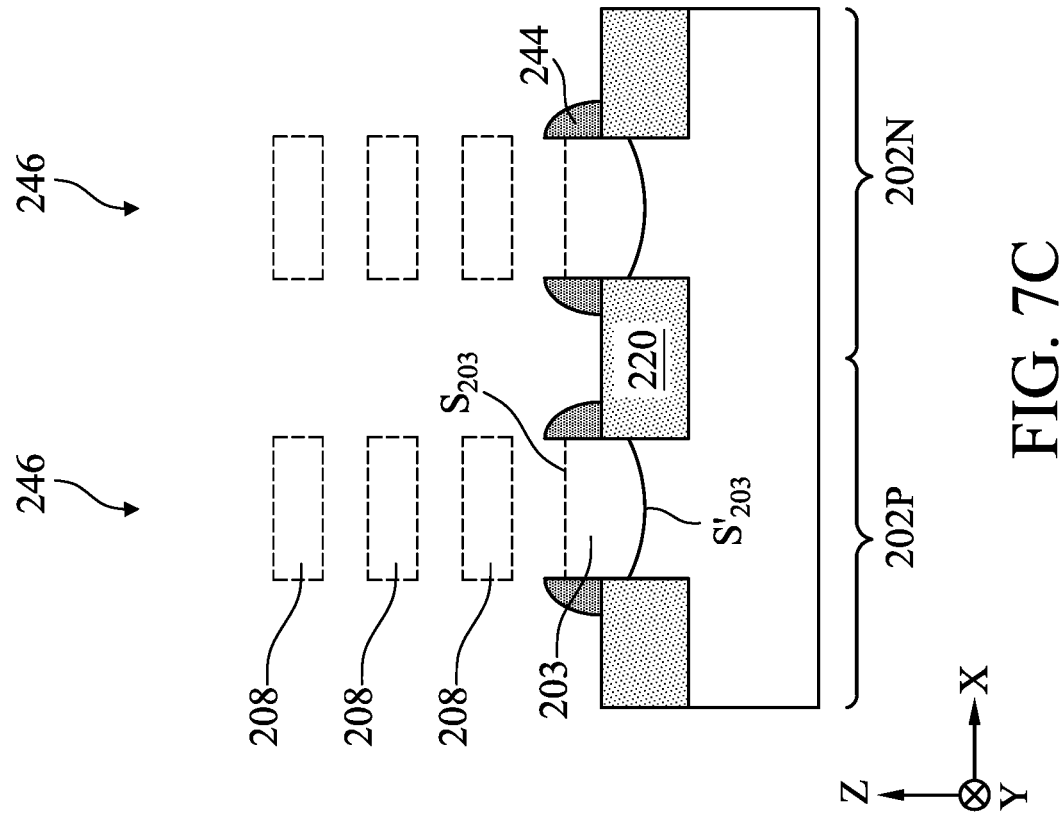
Figures 8A, 8B:
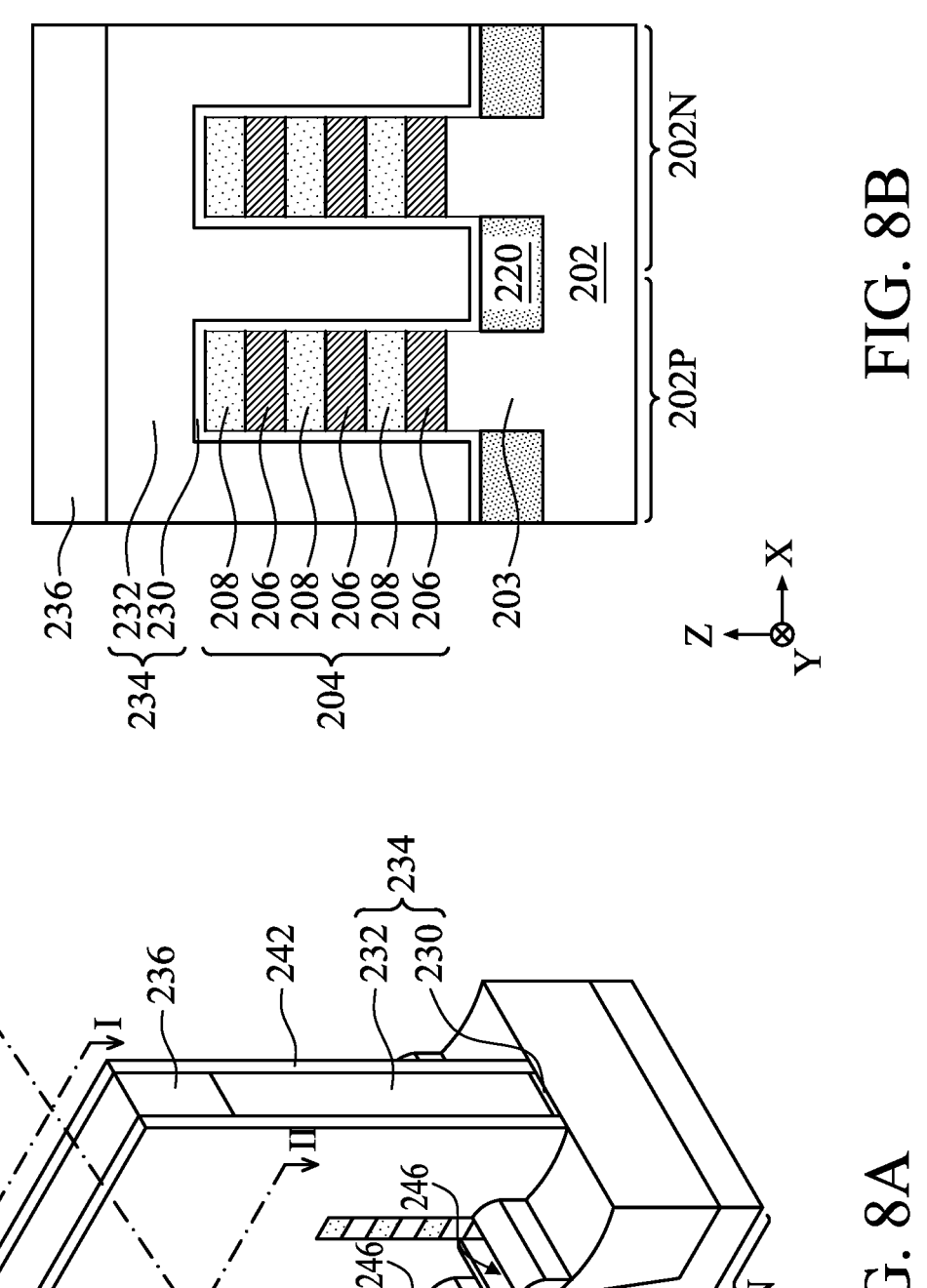
Figure 8D:
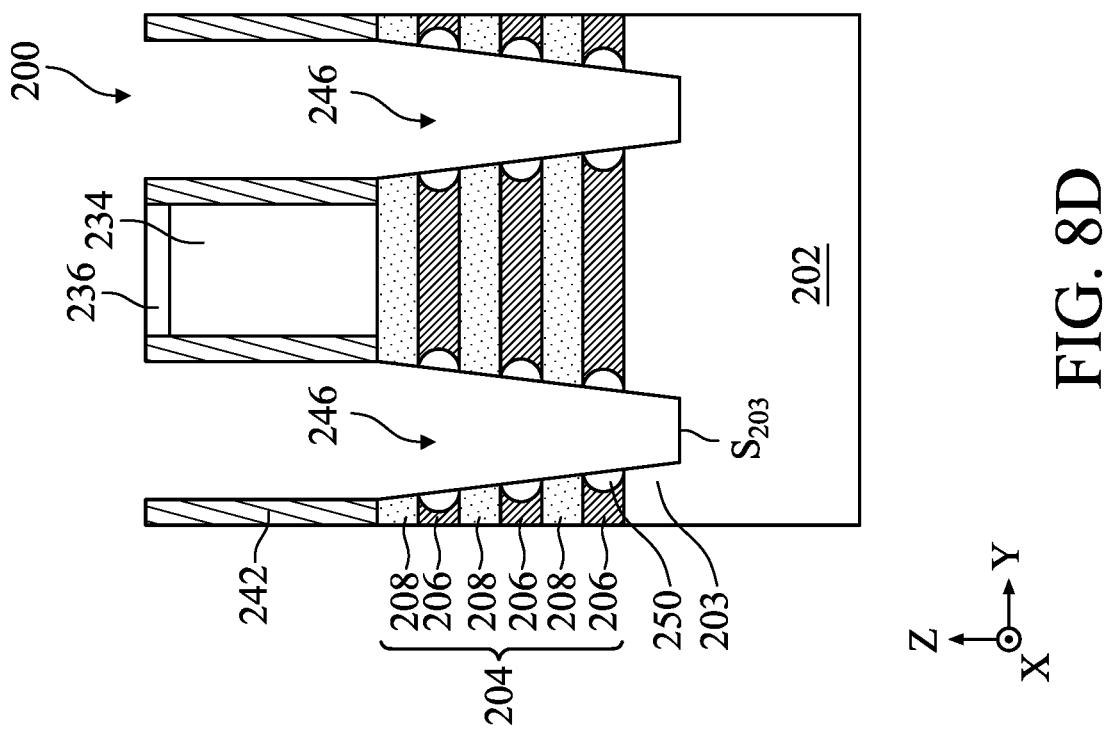
Figure 8C:
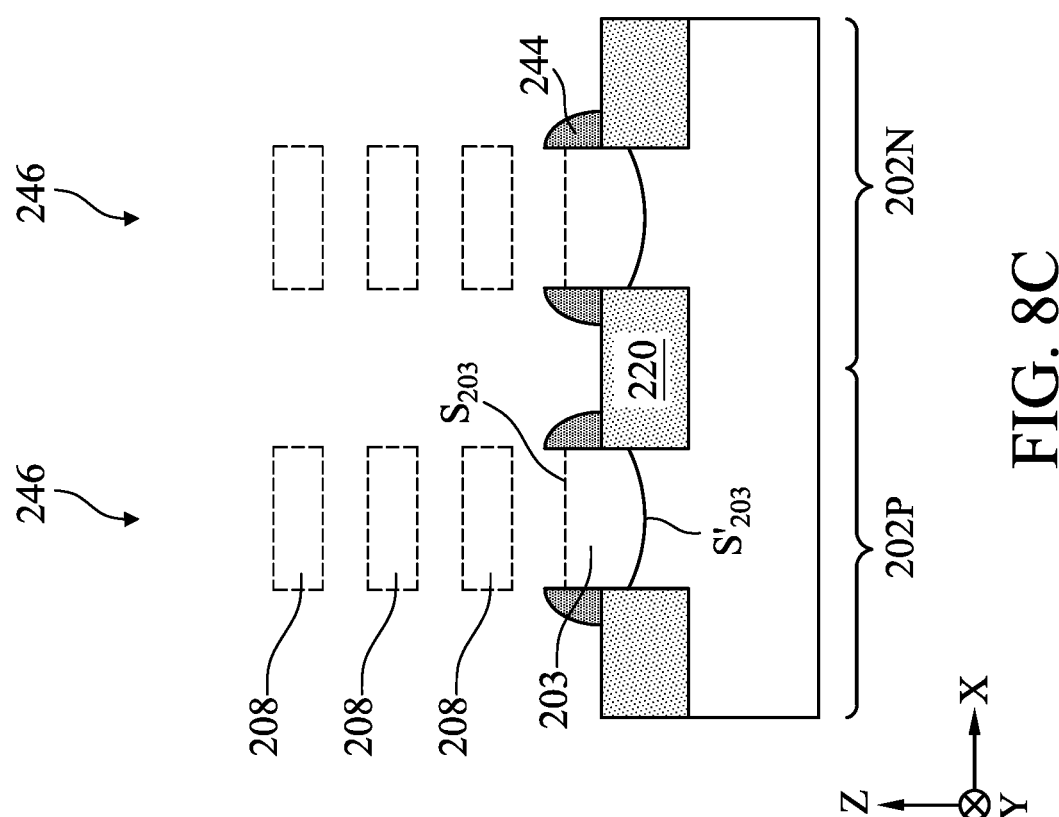

The method 100 is described below in conjunction with FIGS. 2A-21. FIGS. 2A, 3A, 4A, 5A, 6A, 7A, and 8A represent perspective views of an embodiment of a semiconductor device 200 according to various stages of the method 100 of FIG. 1. FIGS. 2B, 3B, 4B, 5B, 6B, 7B, and 8B are cross-sectional views taken in the X-Z plane along the I-I line in the corresponding figures numbered with suffix "A", which cut through a gate region and perpendicular to a lengthwise direction of a channel region of the to-be-formed multi-gate device. FIGS. 7C and 8C are cross-sectional views taken in the X-Z plane along the II-II line in the corresponding figures numbered with suffix "A", which cut through an S/D region and perpendicular to a lengthwise direction of a channel region of the to-be-formed multi-gate device. FIGS. 7D and 8D are cross-sectional views taken in the Y-Z plane along the III-III line in the corresponding figures numbered with suffix "A", which cut through a channel region and adjacent source/drain regions of the to-be-formed multi-gate device. FIGS. 9, 10, 11, 12, 13, 14, 15, 16, 17, 18, 19, and 20 are cross-sectional views of the semiconductor device 200 as in FIG. 8A taken in the X-Z plane along the II-II line in subsequent stages of the method 100 of FIG. 1, which cuts through an S/D region and perpendicular to a lengthwise direction of a channel region of the to-be-formed multi-gate device. FIG. 21 is a cross-sectional view of the device 200 as in FIG. 8A taken in the Y-Z plane along the III-III line at the conclusion of a replacement gate process of the method 100, which cut through a channel region and adjacent source/drain regions of the multi-gate device.

Though the multi-gate device illustrated in the figures is a GAA device, it is understood that the present disclosure is not limited to any particular device configurations. The present disclosure may also provide embodiments for fabricating other multi-gate devices, such as FinFET devices.

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including p-type field effect transistors (PFETs), n-type field effect transistors (NFETs), etc., which may be interconnected. Moreover, it is noted that the process steps of method 100, including any descriptions given with reference to FIGS. 2A-21, as with the remainder of the method and exemplary figures provided in this disclosure, are merely exemplary and are not intended to be limiting beyond what is specifically recited in the claims that follow.

Figure 2A:
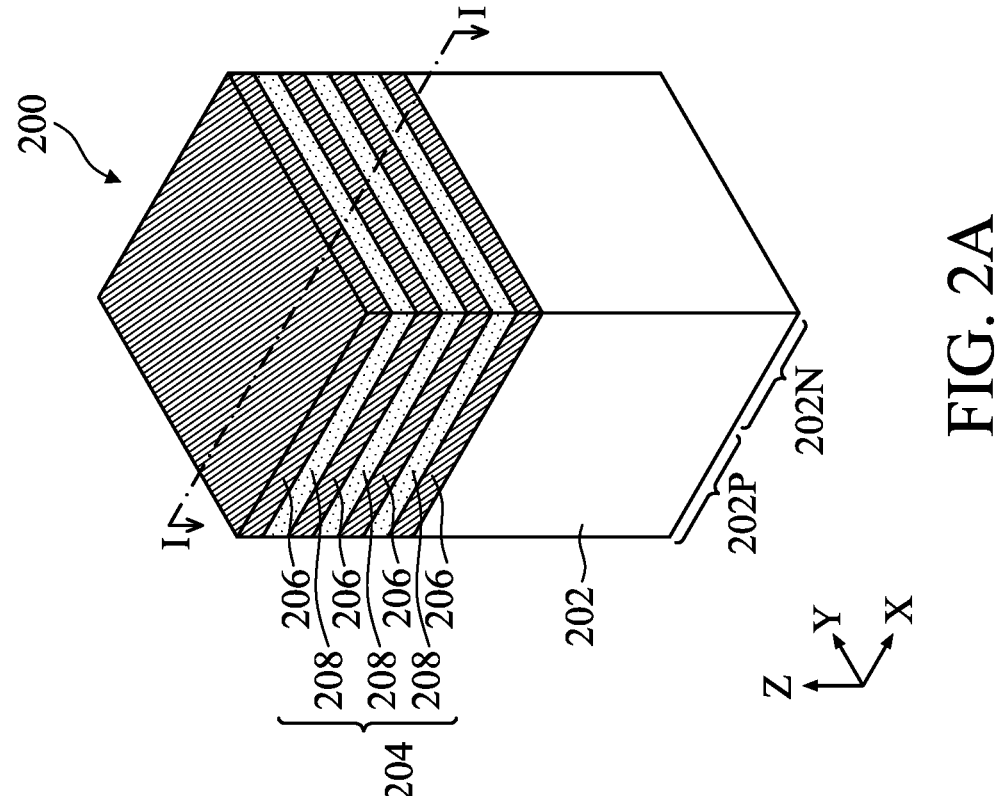
FIGS. 2A, 3A, 4A, 5A, 6A, 7A, and 8A illustrate perspective views of a semiconductor structure during a fabrication process according to the method of FIG. 1, according to one or more aspects of the present disclosure.
Figure 3B:
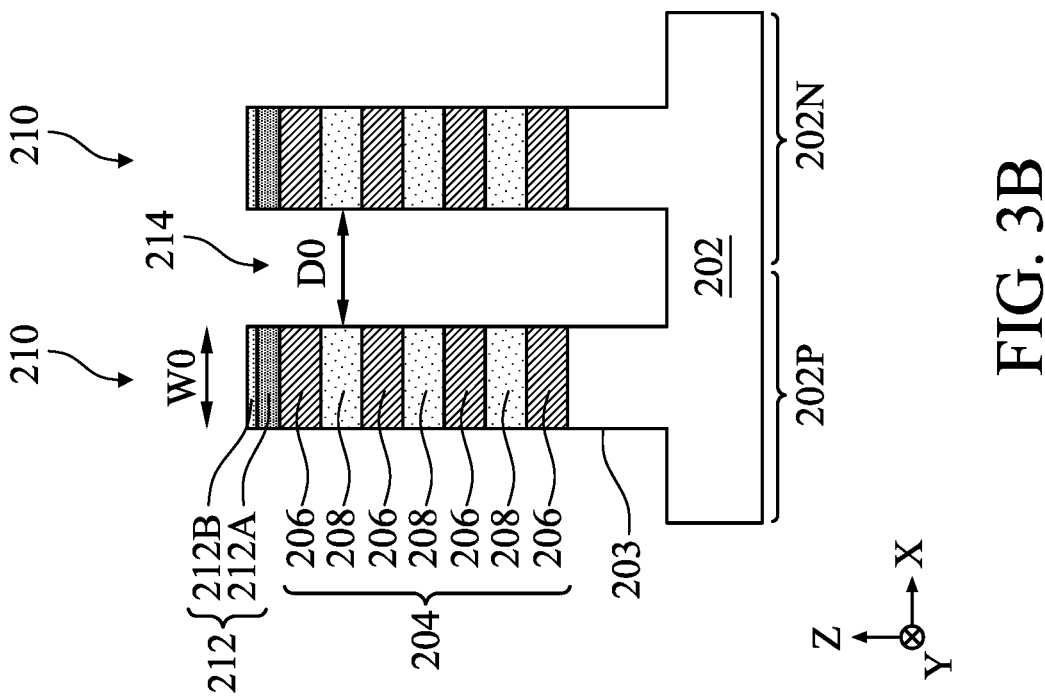
Figure 3A:
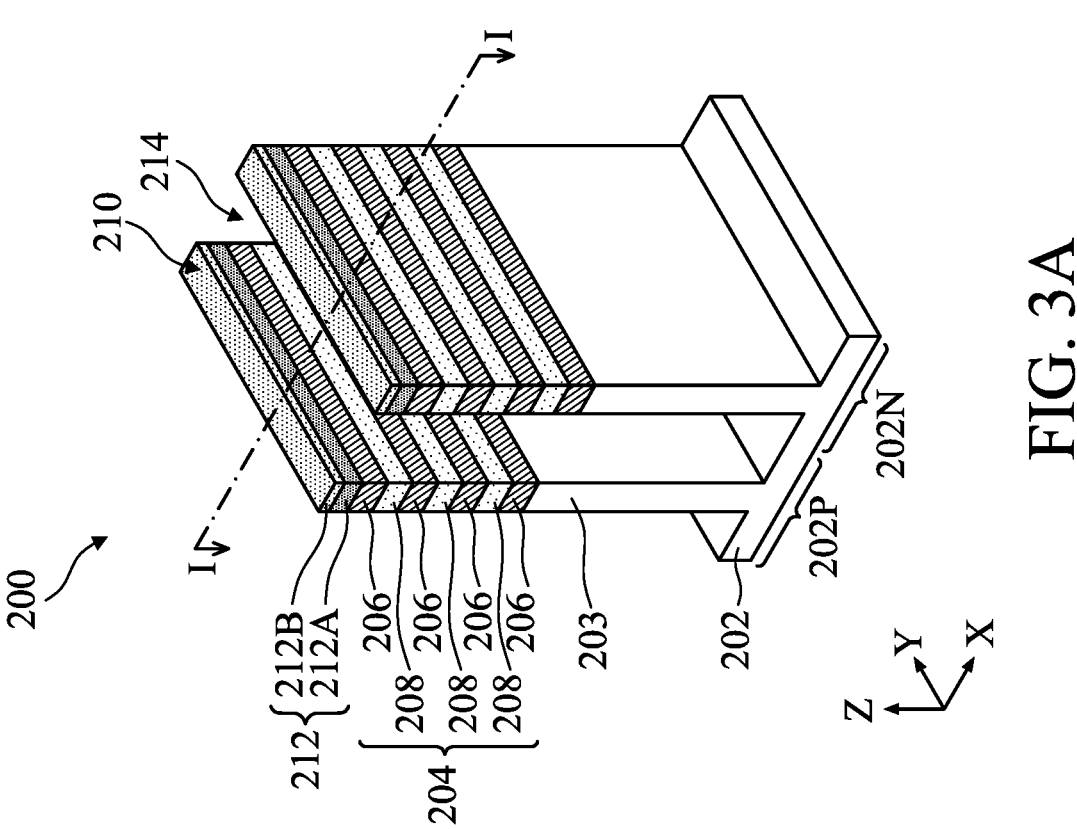

The method 100 at operation 102 (FIG. 1) provides (or is provided with) a semiconductor device (or device) 200. Referring to FIGS. 2A and 2B, the device 200 includes a substrate 202 and an epitaxial stack 204 above the substrate 202. In some embodiments, the substrate 202 may be a semiconductor substrate such as a silicon (Si) substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., NFETs or PFETs). In the depicted embodiment, the device 200 includes two regions 202P and 202N. The region 202P is for forming one or more PFETs, and the region 202N is for forming one or more NFETs. Therefore, the region 202P is also referred to as the PFET region 202P, and the region 202N is also referred to as the NFET region 202N.

The substrate 202 may have isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features.

The epitaxial stack 204 includes epitaxial layers 206 of a first composition interposed by epitaxial layers 208 of a second composition. The first and second compositions can be different. The epitaxial layers 208 may include the same composition as the substrate 202. In the illustrated embodiment, the epitaxial layers 206 are silicon germanium (SiGe) and the epitaxial layers 208 are silicon (Si). However, other embodiments are possible including those that provide for a first composition and a second composition having different oxidation rates and/or etch selectivity. For example, in some embodiments, either of the epitaxial layers 206, 208 of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the epitaxial layers 206 and 208 are substantially dopant-free (i.e., having an extrinsic dopant concentration from about 0 cm$^{-3}$ to about $1 \times 10^{17}$ cm$^{-3}$), where for example, no intentional doping is performed during the epitaxial growth process. By way of example, epitaxial growth of the epitaxial layers 206 and 208 of the respective first and second compositions may be performed by a molecular beam epitaxy (MBE) process, a metalorganic chemical vapor deposition (MOCVD) process, and/or other suitable epitaxial growth processes. In various embodiments, the substrate 202 is a crystalline substrate, and the epitaxial layers 206 and 208 are crystalline semiconductor layers.

In some embodiments, each epitaxial layer 206 has a thickness ranging from about 4 nanometers (nm) to about 8 nm. The epitaxial layers 206 may be substantially uniform in thickness. Yet the top epitaxial layer 206 may be thinner (e.g., half the thickness) than other epitaxial layers 206 thereunder in some embodiments. The top epitaxial layer 206 functions as a capping layer providing protections to other epitaxial layers in subsequent processes. In some embodiments, each epitaxial layer 208 has a thickness ranging from about 4 nm to about 8 nm. In some embodiments, the epitaxial layers 208 of the stack are substantially uniform in thickness. As described in more detail below, the epitaxial layers 208 or portions thereof may form channel member(s) of the to-be-formed multi-gate device 200 and the thickness is chosen based on device performance considerations. The term channel member(s) (or channel layer(s)) is used herein to designate any material portion for channel(s) in a transistor with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The epitaxial layers 206 in channel region(s) may eventually be removed and serve to define a vertical distance between adjacent channel members for a to-be-formed multi-gate device and the thickness is chosen based on device performance considerations. Accordingly, the epitaxial layers 206 may also be referred to as sacrificial layers, and the epitaxial layers 208 may also be referred to as channel layers.

It is noted that four (4) layers of the epitaxial layers 206 and three (3) layers of the epitaxial layers 208 are alternately arranged as illustrated in FIGS. 2A and 2B, which is for illustrative purposes only and not intended to be limiting beyond what is specifically recited in the claims. It can be appreciated that any number of epitaxial layers can be formed in the epitaxial stack 204; the number of layers depending on the desired number of channels members for the device 200. In some embodiments, the number of epitaxial layers 208 is between 2 and 10. It is also noted that while the epitaxial layers 206, 208 are shown as having a particular stacking sequence, where an epitaxial layer 206 is the topmost layer of the epitaxial stack 204, other configurations are possible. For example, in some cases, an epitaxial layer 208 may alternatively be the topmost layer of the epitaxial stack 204. Stated another way, the order of growth for the epitaxial layers 206, 208, and thus their stacking sequence, may be switched or otherwise be different than what is shown in the figures, while remaining within the scope of the present disclosure.

The method 100 then proceeds to operation 104 (FIG. 1) where semiconductor fins (also referred to as fins) are formed by patterning. With reference to the example of FIGS. 3A and 3B, in an embodiment of operation 104, a plurality of fins 210 extending from the substrate 202 are formed. In various embodiments, each of the fins 210 includes a base portion 203 (also referred to as mesa) formed from the substrate 202 and an epitaxial stack portion 204 formed from portions of each of the epitaxial layers of the initial epitaxial stack including epitaxial layers 206 and 208. The fins 210 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 210 by etching initial epitaxial stack 204. The etching process can include dry etching, wet etching, reactive ion etching (RIE), and/or other suitable processes.

In the illustrated embodiment, a hard mask (HM) layer 212 is formed over the epitaxial stack 204 prior to patterning the semiconductor fins 210. In some embodiments, the HM layer 212 includes an oxide layer 212A (e.g., a pad oxide layer that may include silicon oxide) and a nitride layer 212B (e.g., a pad nitride layer that may include silicon nitride) formed over the oxide layer 212A. The oxide layer 212A may act as an adhesion layer between the epitaxial stack 204 and the nitride layer 212B and may act as an etch stop layer for etching the nitride layer 212B. In some examples, the HM layer 212 includes thermally grown oxide, chemical vapor deposition (CVD)-deposited oxide, and/or atomic layer deposition (ALD)-deposited oxide. In some embodiments, the HM layer 212 includes a nitride layer deposited by CVD and/or other suitable technique.

The fins 210 may subsequently be fabricated using suitable processes including photolithography and etch processes. The photolithography process may include forming a photoresist layer (not shown) over the HM layer 212, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process forms trenches 214 in unprotected regions through the HM layer 212, through the epitaxial stack 204, and into the substrate 202, thereby leaving the plurality of extending fins 210. The trenches 214 may be etched using dry etching, wet etching, RIE, and/or other suitable processes. In some examples, a width W0 of the fins 210 ranges from about 20 nm to about 30 nm, and a distance D0 between adjacent fins 210 ranges from about 30 nm to about 50 nm.

Numerous other embodiments of methods to form fins on the substrate may also be used including, for example, defining the fin region (e.g., by mask or isolation regions) and epitaxially growing the epitaxial stack 204 in the form of the fins 210. In some embodiments, forming the fins 210 may include a trim process to decrease the width of the fins 210. The trim process may include wet and/or dry etching processes.

Figure 4B:
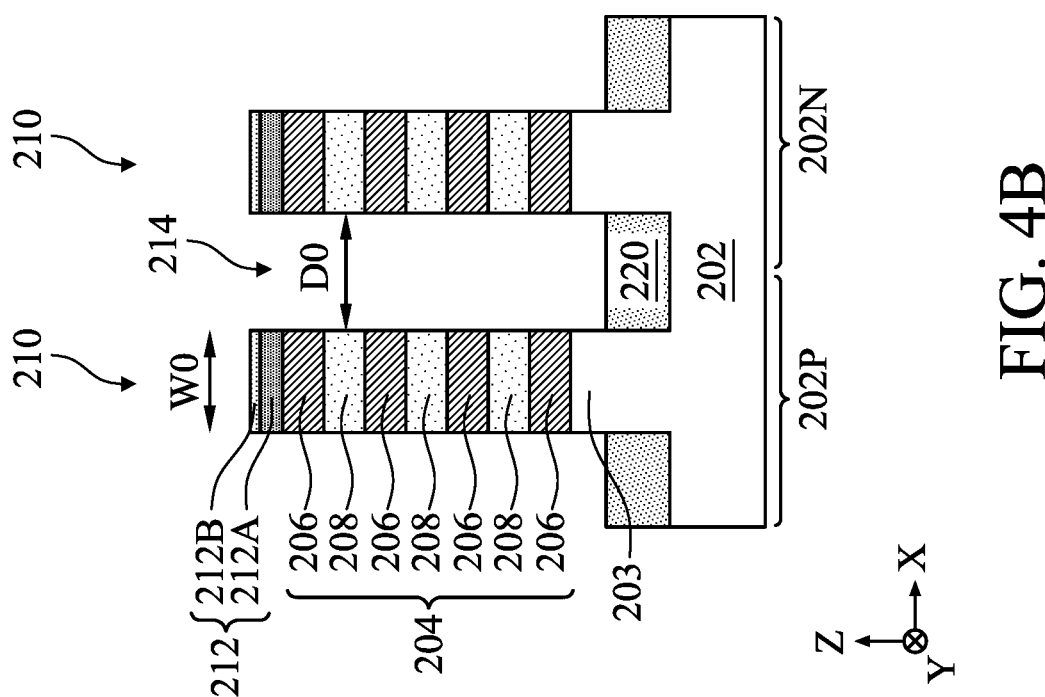
Figure 4A:
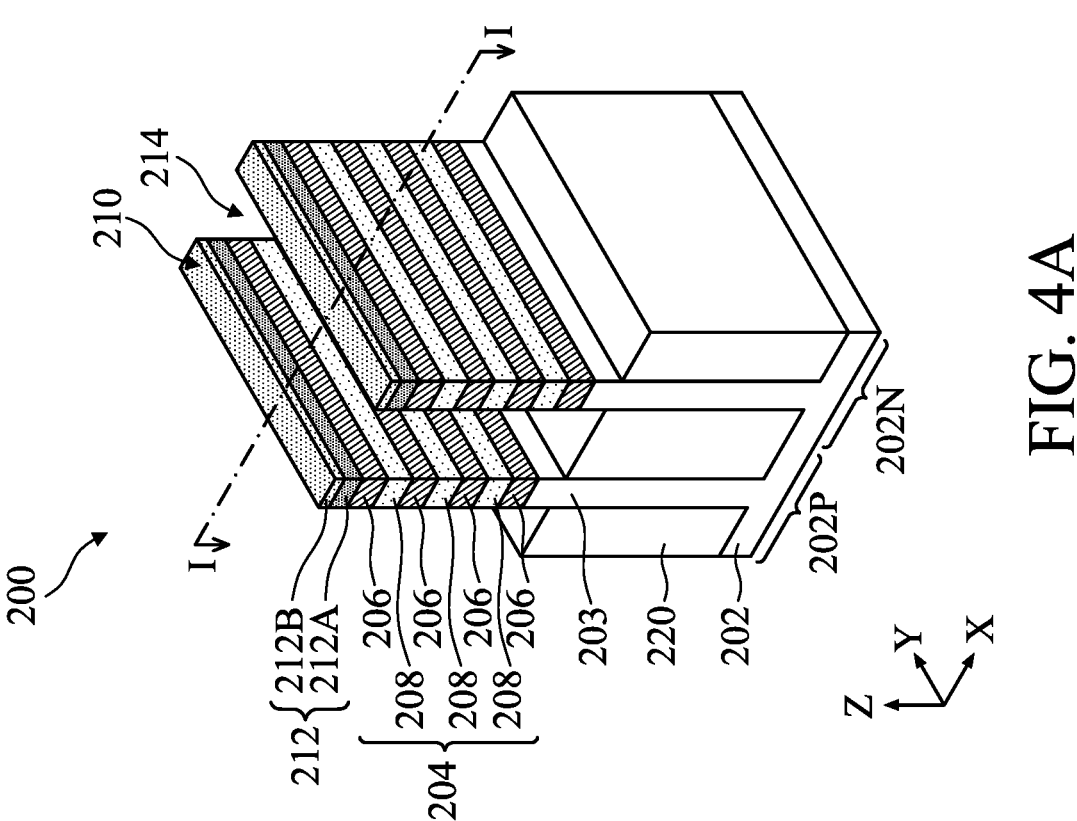

At operation 106, the method 100 (FIG. 1) forms an isolation feature, such as a shallow trench isolation (STI) feature, between the fins 210. Referring to FIGS. 4A and 4B, a STI feature 220 is disposed on the substrate 202 interposing the fins 210. By way of example, in some embodiments, a dielectric layer is first deposited over the substrate 202, filling the trenches 214 with dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a SACVD process, a flowable CVD process, an ALD process, a PVD process, and/or other suitable process. In some embodiments, after deposition of the dielectric layer, the device 200 may be annealed, for example, to improve the quality of the dielectric layer. In some embodiments, the dielectric layer may include a multi-layer structure, for example, having one or more liner layers.

In some embodiments of forming the isolation (STI) feature, after deposition of the dielectric layer, the deposited dielectric material is thinned and planarized, for example by a chemical mechanical polishing (CMP) process. In some embodiments, the HM layer 212 functions as a CMP stop layer. Subsequently, the dielectric layer interposing the fins 210 are recessed. Still referring to the example of FIGS. 4A and 4B, the STI feature 220 is recessed providing the fins 210 extending above the STI feature 220. In some embodiments, the recessing process may include a dry etching process, a wet etching process, and/or a combination thereof. In some embodiments, a recessing depth is controlled (e.g., by controlling an etching time) so as to expose upper portion of the fins 210. In the illustrated embodiment, each layer of the epitaxial stack 204 is exposed. In furtherance of embodiments, a top surface of the STI feature 220 is recessed below the bottommost epitaxial layer 206. After the recessing process, the HM layer 212 and the topmost epitaxial layer 206 may also be removed, for example, by a wet etching process using $H_3PO_4$ or other suitable etchants.

The method 100 then proceeds to operation 108 (FIG. 1) where a dummy gate structure is formed. While the present discussion is directed to a replacement gate (or gate-last) process whereby a dummy gate structure (or referred to as a sacrificial gate structure) is formed and subsequently replaced, other configurations may be possible. With reference to FIGS. 5A and 5B, a dummy gate structure 234 is formed. The dummy gate structure 234 will be replaced by a final gate stack at a subsequent processing stage of the method 100. In particular, the dummy gate structure 234 may be replaced at a later processing stage by a high-k dielectric layer (HK) and metal gate electrode (MG), as will be discussed in more detail below. In some embodiments, the dummy gate structure 234 is disposed over the fins 210 and the STI feature 220. The portion of the fins 210 underlying the dummy gate structure 234 may be referred to as the channel region. The dummy gate structure 234 may also define source/drain (S/D) regions of the fins 210, for example, the regions of the fin 210 adjacent and on opposing sides of the channel region.

In some embodiments, the dummy gate structure 234 is formed by various process steps such as layer deposition, patterning, etching, as well as other suitable processing steps. Exemplary layer deposition processes include CVD (including low-pressure CVD, plasma-enhanced CVD, and/or flowable CVD), PVD, ALD, thermal oxidation, e-beam evaporation, or other suitable deposition techniques, or combinations thereof. In some embodiments, the dummy gate structure 234 includes a dummy dielectric layer 230 and a dummy electrode layer 232. In some embodiments, the dummy dielectric layer 230 may include $SiO_2$, silicon nitride, a high-k dielectric material and/or other suitable material. Subsequently, the dummy electrode layer 232 is deposited. In some embodiments, the dummy electrode layer 232 may include polycrystalline silicon (polysilicon). In forming the dummy gate structure 234 for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate structure 234 is patterned through a hard mask 236. The hard mask 236 may include multiple layers, such as an oxide layer and a nitride layer over the oxide layer. In some embodiments, after formation of the dummy gate structure 234, the dummy dielectric layer 230 is removed from the S/D regions of the fins 210. The etch process may include a wet etch, a dry etch, and/or a combination thereof. The etch process is chosen to selectively etch the dummy dielectric layer 230 without substantially etching the fins 210, the hard mask 236, and the dummy electrode layer 232.

At operation 110, the method 100 (FIG. 1) forms sidewall spacers on sidewall surfaces of the dummy gate structure 234 and sidewall surfaces of the fins 210. With reference to FIGS. 6A and 6B, after the dummy gate structure 234 is formed, a blanket layer 240 of an insulating material for sidewall spacers is conformally formed by using CVD or other suitable methods. The blanket layer 240 is deposited in a conformal manner so that it is formed to have substantially equal thicknesses on various surfaces, such as the sidewalls, horizontal surfaces, and the top of the dummy gate structure. In some embodiments, the blanket layer 240 is deposited to a thickness in a range from about 2 nm to about 10 nm. In one embodiment, the insulating material of the blanket layer 240 is a silicon nitride-based material, such as SiN, SiON, SiOCN or SiCN and combinations thereof. The blanket layer 240 is then etched using an anisotropic process to form gate sidewall spacers 242 on opposite sidewalls of the dummy gate structure 234 and fin sidewall spacers 244 on opposite sidewalls of the fins 210, such as shown in FIGS. 7A and 7C. The anisotropic etching performed on the blanket layer 240 can be, for example, reactive ion etching (RIE). During the anisotropic etching process, most of the insulating material is removed from horizontal surfaces, leaving the dielectric spacer layer on the vertical surfaces such as the sidewalls of the dummy gate structure 234 and the sidewalls of the exposed fins 210. In the illustrated embodiment, a topmost portion of the fin sidewall spacers 244 is above a top surface (denoted as $S_{203}$ in FIG. 7C) of the base portion (mesa) 203. For example, the top surface $S_{203}$ of the base portion 203 may intersect an inner sidewall of the fin sidewall spacers 244. In various embodiments, the top surface of the base portion 203 may be above or below the topmost portion of the fin sidewall spacers 244.

At operation 112, the method 100 (FIG. 1) recesses the fins 210 in the S/D regions in forming S/D recesses. With reference to FIGS. 7A-7D, a source/drain etch process is performed to form the S/D recesses 246 by removing portions of the fins 210 not covered by the dummy gate structure 234 (e.g., in source/drain regions) and that were previously exposed (e.g., during the blanket layer 240 etch-back process). In particular, the source/drain etch process may serve to remove the exposed epitaxial layer portions 206 and 208 in source/drain regions of the device 200 to expose the base portion 203 of the fins 210. In some embodiments, the source/drain etch process may include a dry etching process, a wet etching process, and/or a combination thereof. In some embodiments, a recessed depth is controlled (e.g., by controlling an etching time) such that the top surface $S_{203}$ of the base portion 203 is recessed to be under the top surface of the STI feature 220 (the recessed top surface in the S/D regions is denoted as S'203 in FIG. 7C), such as for about 2 nm to about 5 nm in some examples. To better illustrate positions of the base portion and the channel layers that remain intact in the channel region, FIG. 7C imposes contours (represented by dashed lines) of the base portion 203 and the epitaxial layers 208 in the channel regions. Due to the loading effect during the source/drain etch process, sidewalls of the S/D recesses 246 may have a tapered profile (FIG. 7D), such that the S/D recesses 246 are narrower in the bottom portion and wider in the top portion, and consequently the fin 210 between two adjacent S/D recesses 246 is wider in the bottom portion and narrower in the top portion.

At operation 114, the method 100 (FIG. 1) forms inner spacers. With reference to FIGS. 8A-8D, inner spacer cavities are formed by laterally recessing the epitaxial layers 206 through S/D recesses 246, and inner spacers 250 are subsequently formed in the inner spacer cavities. In some embodiments of operation 114, a lateral etching (or horizontal recessing) is performed to recess the epitaxial layers 206 to form inner spacer cavities. The amount of etching of the epitaxial layers 206 is in a range from about 2 nm to about 10 nm in some embodiments. When the epitaxial layers 206 are SiGe, the lateral etching process may use an etchant selected from, but not limited to, ammonium hydroxide (NH$_4$OH), tetramethylammonium hydroxide (TMAH), ethylenediamine pyrocatechol (EDP), and potassium hydroxide (KOH) solutions. Subsequently, an insulating layer is formed on the lateral ends of the epitaxial layers 206 to fill the inner spacer cavities, thereby forming inner spacers 250. The insulating layer may include a dielectric material, such as SiN, SiOC, SiOCN, SiCN, SiO$_2$, and/or other suitable material. In some embodiments, the insulating layer is conformally deposited in the S/D recesses 246, for example, by ALD or any other suitable method. After the conformal deposition of the insulating layer, an etch-back process is performed to partially remove the insulating layer from outside of the inner spacer cavities. By this etching the insulating layer remains substantially within the inner spacer cavities.

In FIGS. 3A-8A, only one fin 210 is depicted in each of the PFET region 202P and the NFET region 202N. It is understood that the present disclosure is not limited to any particular number of fins and regions. For example, in FIGS. 9-20, two fins 210 are depicted in each of the PFET region 202P and the NFET region 202N for illustration purposes. FIGS. 9-20 are cross-sectional views of the semiconductor device 200 as in FIG. 8A taken in the X-Z plane along the II-II line in subsequent stages of the method 100, which cuts through the S/D region.

Figure 9:
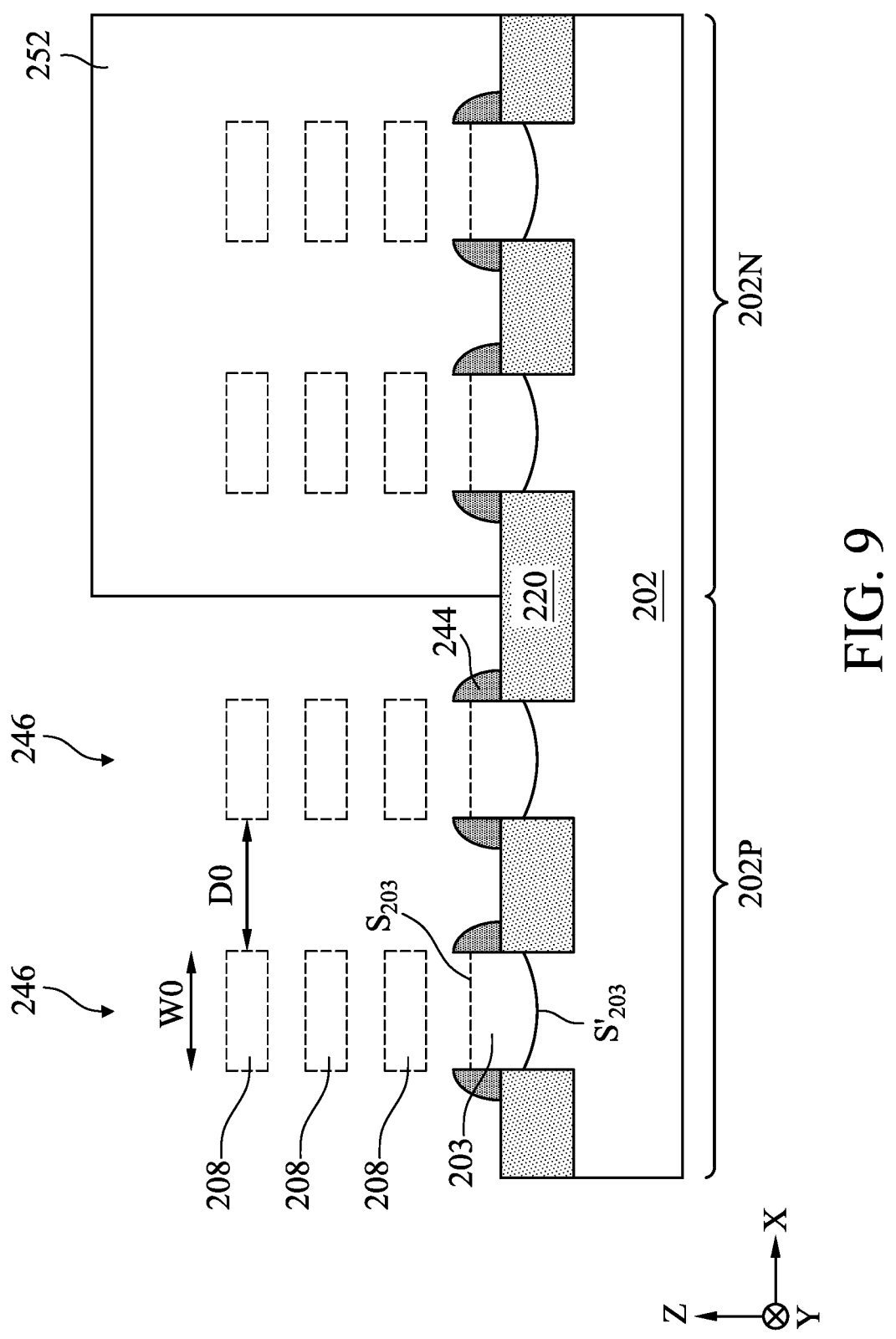

Referring to FIG. 9, at operation 116, the method 100 (FIG. 1) deposits a patterned mask layer 252 covering one of the PFET region 202P and the NFET region 202N. FIG. 9 illustrates the NFET region 202N as the one covered by the patterned mask layer 252 and the PFET region 202P as the one exposed in openings of the patterned mask layer 252. Yet, it is understood that a configuration of covering the PFET region 202P and exposing the NFET region 202N is equally applicable during subsequent operations of the method 100.

In some embodiments, the patterned mask layer 252 is a hard mask layer comprising a single layer or a multi-layer. For example, the hard mask layer may include a silicon oxide layer and a silicon nitride layer over the silicon oxide layer. The hard mask layer may be formed using chemical vapor deposition (CVD), low-pressure CVD (LPCVD), plasma-enhanced CVD (PECVD), physical vapor deposition (PVD), atomic layer deposition (ALD), thermal oxidation, electron-beam (e-beam) evaporation, or other suitable deposition techniques, or combinations thereof. The hard mask layer is patterned using any suitable methods such as a photolithography process, which may include forming a resist layer on the hard mask layer, exposing the resist by a lithography exposure process, performing a post-exposure bake process, developing the photoresist layer to form the patterned photoresist layer that exposes part of the hard mask layer, patterning the hard mask layer, and finally removing the patterned resist layer. The lithography process may be alternatively replaced by other suitable techniques, such as e-beam writing, ion-beam writing, maskless patterning or molecular printing.

In some embodiments, the patterned mask layer 252 is a resist layer, such as a tri-layer resist layer that includes a bottom layer, a middle layer, and a top photoresist layer. In furtherance of embodiments, the bottom layer may include a carbon rich polymer material (e.g., $C_xH_yO_z$), the middle layer may include a silicon rich polymer material (e.g., SiC$_x$H$_y$O$_z$), and the top photoresist layer may include a carbon rich polymer material (e.g., $C_xH_yO_z$) with a photosensitive component that undergoes a property change when exposed to radiation. The patterning of the top photoresist layer may be achieved, for example, by using an immersion photolithography system to expose portions of the top photoresist layer and developing the exposed or unexposed portions depending on whether a positive or negative photoresist is used. The middle layer is then etched through the openings in the top photoresist layer. In this manner, the top photoresist layer serves as an etch mask limiting the etch process in the PFET region 202P. The bottom layer is subsequently etched through the openings in the top photoresist layer and the middle layer. In this manner, the top photoresist layer and the middle layer collectively serve as an etch mask limiting the etch process in the PFET region 202P.

Figure 10:
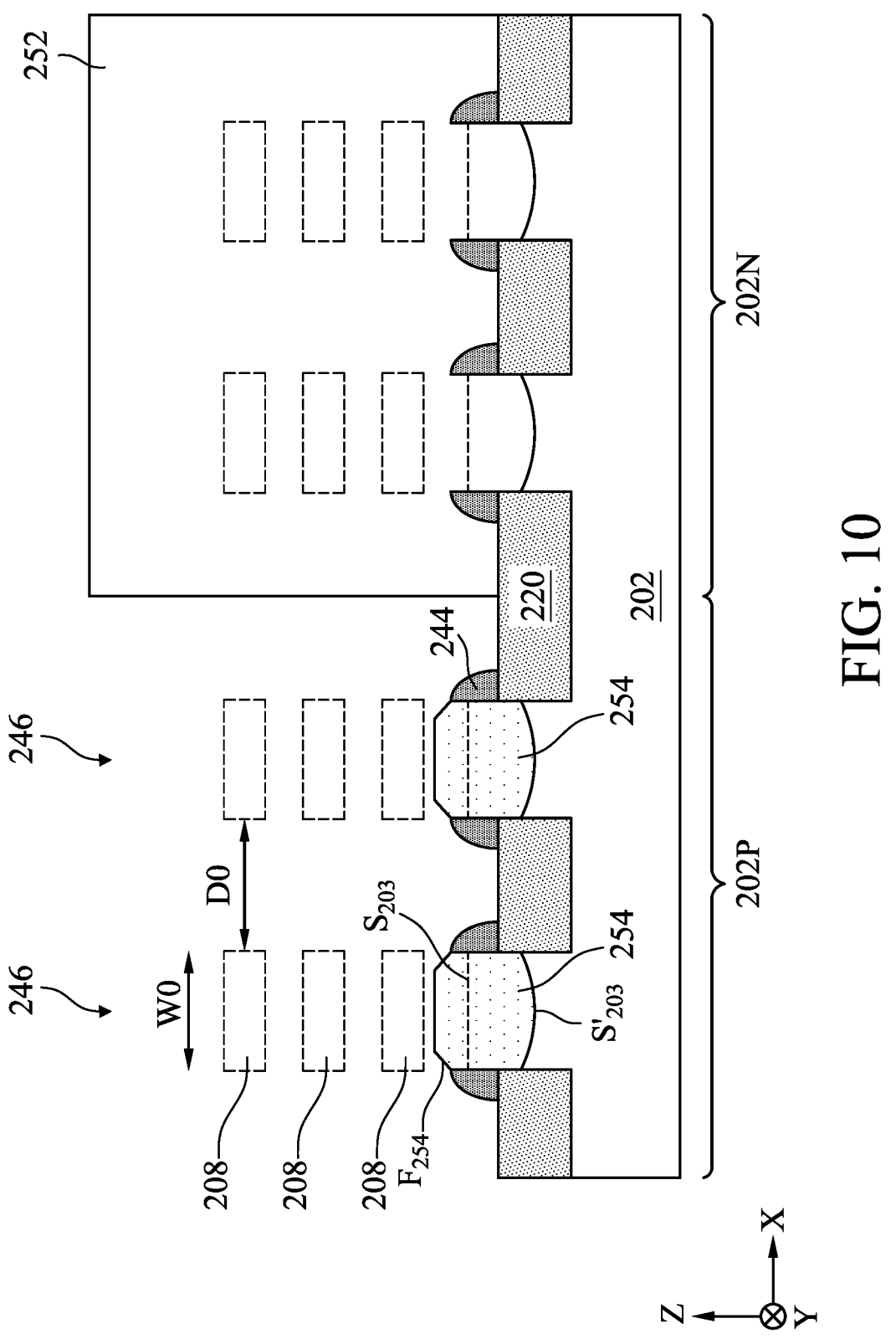

Referring to FIG. 10, at operation 118, the method 100 (FIG. 1) forms a buffer epitaxial layer 254 at the bottom of the S/D recesses 246 in the PFET region 202P. The buffer epitaxial layer 254 is epitaxially grown from the recessed top surface S'203 of the base portion 203 in the S/D regions. The buffer epitaxial layer 254 may also be referred to as the lower epitaxial layer 254. By way of example, epitaxial growth of the buffer epitaxial layer 254 may be performed by vapor-phase epitaxy (VPE), ultra-high vacuum CVD (UHV-CVD), molecular beam epitaxy (MBE), and/or other suitable processes. In some embodiments, the buffer epitaxial layer 254 includes the same material as the substrate 202, such as silicon (Si). In some alternative embodiments, the buffer epitaxial layer 254 includes a different semiconductor material than the Si substrate 202, such as SiGe, SiSn, or other suitable semiconductor material. In some embodiments, the buffer epitaxial layer 254 is dopant-free, where for example, no intentional doping is performed during the epitaxial growth process. As a comparison, in one instance, the substrate 202 is lightly doped and has a higher doping concentration than the buffer epitaxial layer 254. The buffer epitaxial layer 254 provides a high resistance path from the S/D regions to the semiconductor substrate, such that the leakage current in the semiconductor substrate (i.e., through the base portion 203) is suppressed. Alternatively, the buffer epitaxial layer 254 may be slightly doped with dopants such as germanium (Ge) or boron (B). In one example, the dopant is boron and the buffer epitaxial layer 254 includes SiB, SiGeB, SiSnB, or other suitable semiconductor material with a boron molar concentration from about $1\times10^{20}$ $cm^{-3}$ to about $5\times10^{20}$ $cm^{-3}$. In another example, the dopant is germanium and the buffer epitaxial layer 254 includes SiGe, SiGeB, or other suitable semiconductor material with a germanium atomic percentage from about 1% to about 20%.

The fin sidewall spacers 244 limit the lateral growth of the buffer epitaxial layer 254 within opposing inner sidewalls of the fin sidewall spacers 244. The buffer epitaxial layer 254 exhibits faceted growth when it raises above the fin sidewall spacers 244. FIG. 10 illustrates facets $F_{254}$ at the upper portion of the buffer epitaxial layer 254. The growth of the buffer epitaxial layer 254 is under time control such that top surface of the buffer epitaxial layer 254 is above the top surface $S_{203}$ of the base portion 203 in the channel region and also partially overlaps with a bottommost inner spacer 250 (between the bottommost epitaxial layer 208 and the base portion 203 in the channel region). The bottommost inner spacer 250 is interposed between the buffer epitaxial layer 254 and the bottommost epitaxial layer 206. The buffer epitaxial layer 254 is in physical contact with a lower portion of the bottommost inner spacer 250. The vertical sidewall (in X-Z plane) of the base portion 203 in the channel region (as exposed in the S/D recesses 246) is in physical contact with and fully covered by the buffer epitaxial layer 254. The buffer epitaxial layer 254 protects the base portion 203 in the channel region from dopant diffusion when an upper S/D epitaxial layer with a higher dopant concentration is subsequently formed in the S/D recesses 246, which will be explained in further detail below.

Figure 11:
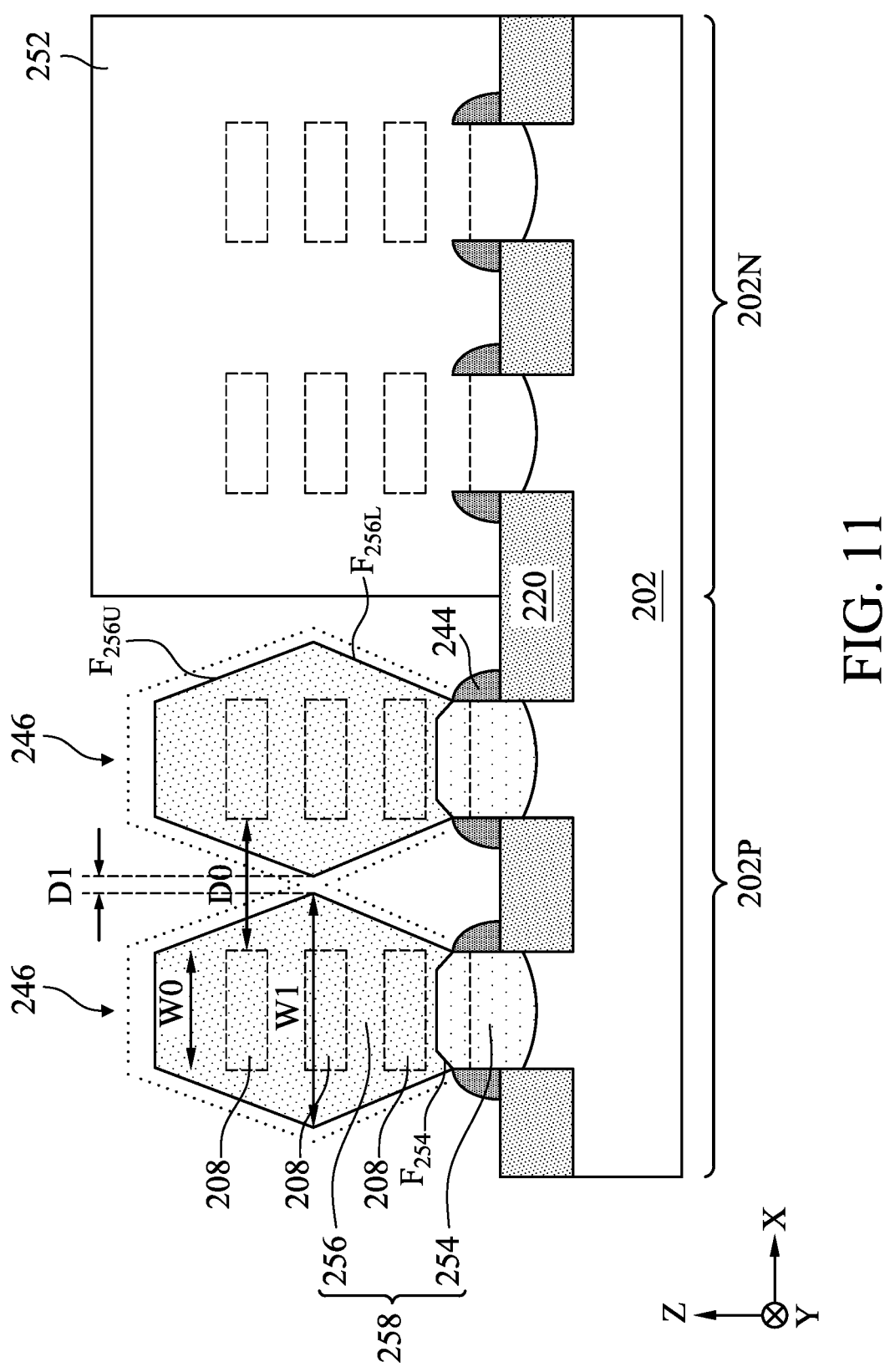

Referring to FIG. 11, at operation 120, the method 100 (FIG. 1) forms an upper epitaxial layer 256 on the buffer epitaxial layer 254 in each of the S/D recesses 246 in the PFET region 202P. The upper epitaxial layer 256 and the buffer epitaxial layer 254 (or lower epitaxial layer 254) in each of the S/D recesses 246 collectively define a p-type S/D epitaxial feature 258 (or p-type S/D feature 258). By way of example, epitaxial growth of the upper epitaxial layer 256 may be performed by vapor-phase epitaxy (VPE), ultra-high vacuum CVD (UHV-CVD), molecular beam epitaxy (MBE), and/or other suitable processes. The upper epitaxial layer 256 may include SiGe, SiSn, or other suitable semiconductor material. The upper epitaxial layer 256 may be doped with dopants such as germanium (Ge) or boron (B). Generally, the upper epitaxial layer 256 includes higher dopant concentration than the buffer epitaxial layer 254. In one example, the upper epitaxial layer 256 is doped with boron (B) and the upper epitaxial layer 256 includes SiGeB, SiSnB, or other suitable semiconductor material with a boron molar concentration from about $4\times10^{20}$ $cm^{-3}$ to about $2\times10^{21}$ $cm^{-3}$. When the upper epitaxial layer 256 includes germanium, a germanium atomic percentage may range from about 10% to about 60%. In some embodiments, the upper epitaxial layer 256 includes the same semiconductor material with the buffer epitaxial layer 254 but with a higher dopant concentration. For example, the upper epitaxial layer 256 and the buffer epitaxial layer 254 may both include SiGe doped with boron (e.g., SiGeB), while the upper epitaxial layer 256 includes higher concentrations of both boron and germanium than the buffer epitaxial layer 254. The upper epitaxial layer 256 has the same crystalline orientation with the substrate 202 and the buffer epitaxial layer 254. In the illustrated embodiment, the upper epitaxial layer 256 has upper facets (upward-facing facets) $F_{256U}$ and lower facets (downward-facing facets) $F_{256L}$. The facets $F_{256U}$ and $F_{256L}$ may have a (111) crystalline orientation or a (110) crystalline orientation.

The upper epitaxial layer 256 is formed in S/D regions adjacent to and on both sides of the dummy gate structure 234. For example, the upper epitaxial layers 256 is in contact with the inner spacers 250 and the channel layers 208 (epitaxial layers 208). The growth of the upper epitaxial layer 256 is under time control such that the top surface of the upper epitaxial layer 256 is above the top surface of the topmost channel layer 208, and the width of the upper epitaxial layer 256 is larger than the width W0 of the channel layer 208, such that the upper epitaxial layer 256 fully covers sidewalls (in X-Z plane) of each of the channel layers 208. In other words, no channel layer 208 is exposed in the S/D recesses 246 after being covered by the upper epitaxial layer 256. The bottom portion of the upper epitaxial layer 256 is in contact with the fin sidewall spacers 244 and fully covers the top surface of the buffer epitaxial layer 254, including the facets $F_{254}$ of the buffer epitaxial layer 254, but is separated from the base portion 203. In other words, the buffer epitaxial layer 254 fully covers sidewalls (in X-Z plane) of the base portion 203 with sufficient margin, such that the upper epitaxial layer 256 is separated from the base portion 203 by the buffer epitaxial layer 254 for a distance that is sufficient to prevent dopants of high concentration diffusing into the base portion 203. This configuration helps mitigating substrate current leakage.

In some embodiments, a ratio of the largest width W1 of the upper epitaxial layer 256 and the width W0 of the channel layer 208 is greater than about 1.2:1, and a difference between W1 and W0 (W1−W0) ranges from about 10 nm to about 25 nm. In some embodiments, a lateral distance D1 between adjacent upper epitaxial layers 256 ranges from about 5 nm to 40 nm. In some embodiments, the growth of the upper epitaxial layer 256 is under time control such that adjacent upper epitaxial layer 256 connect with each other and merge into one larger upper epitaxial layer 256, such as represented by the dotted contour in FIG. 11.

Figure 12:
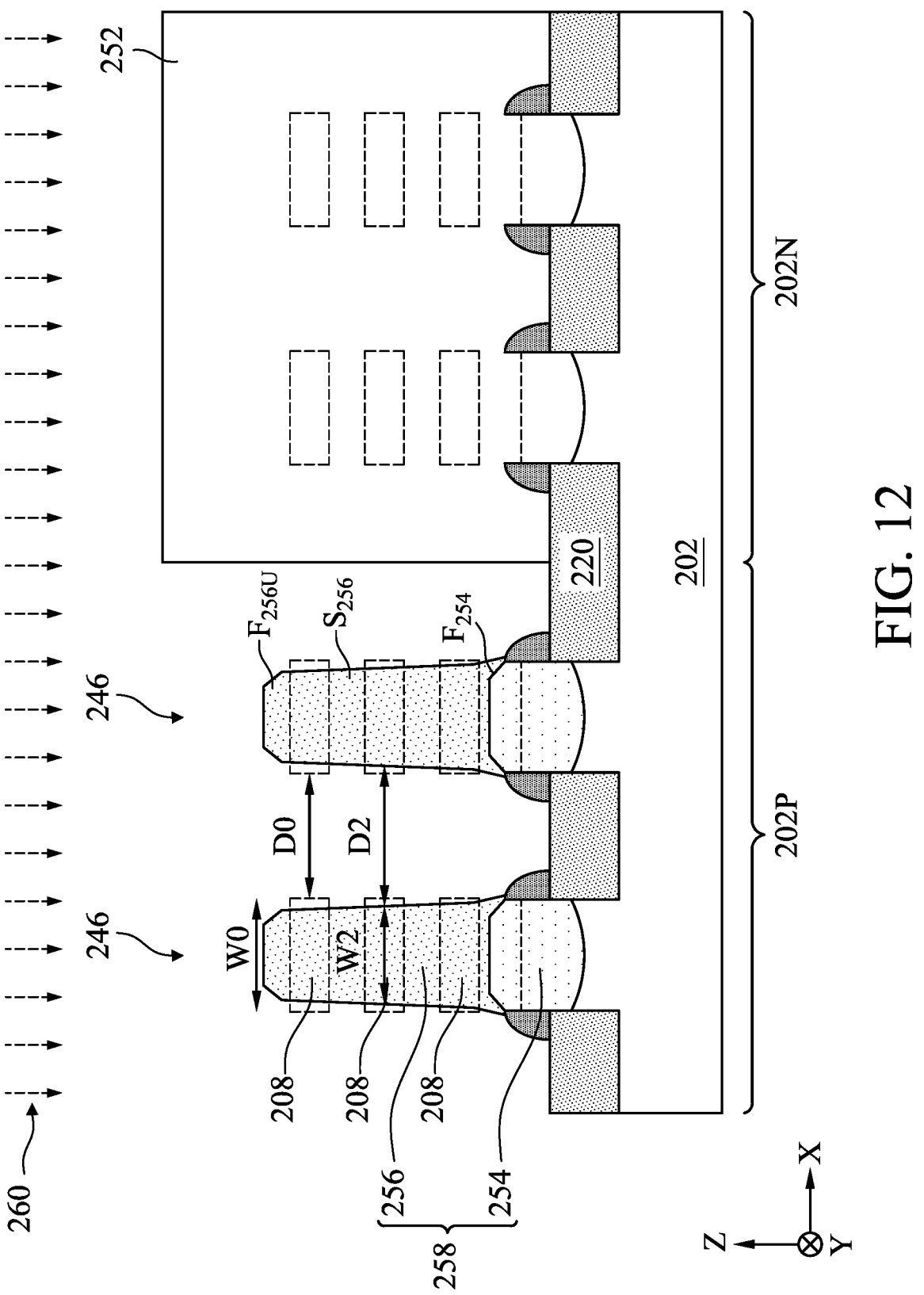
Figure 13:
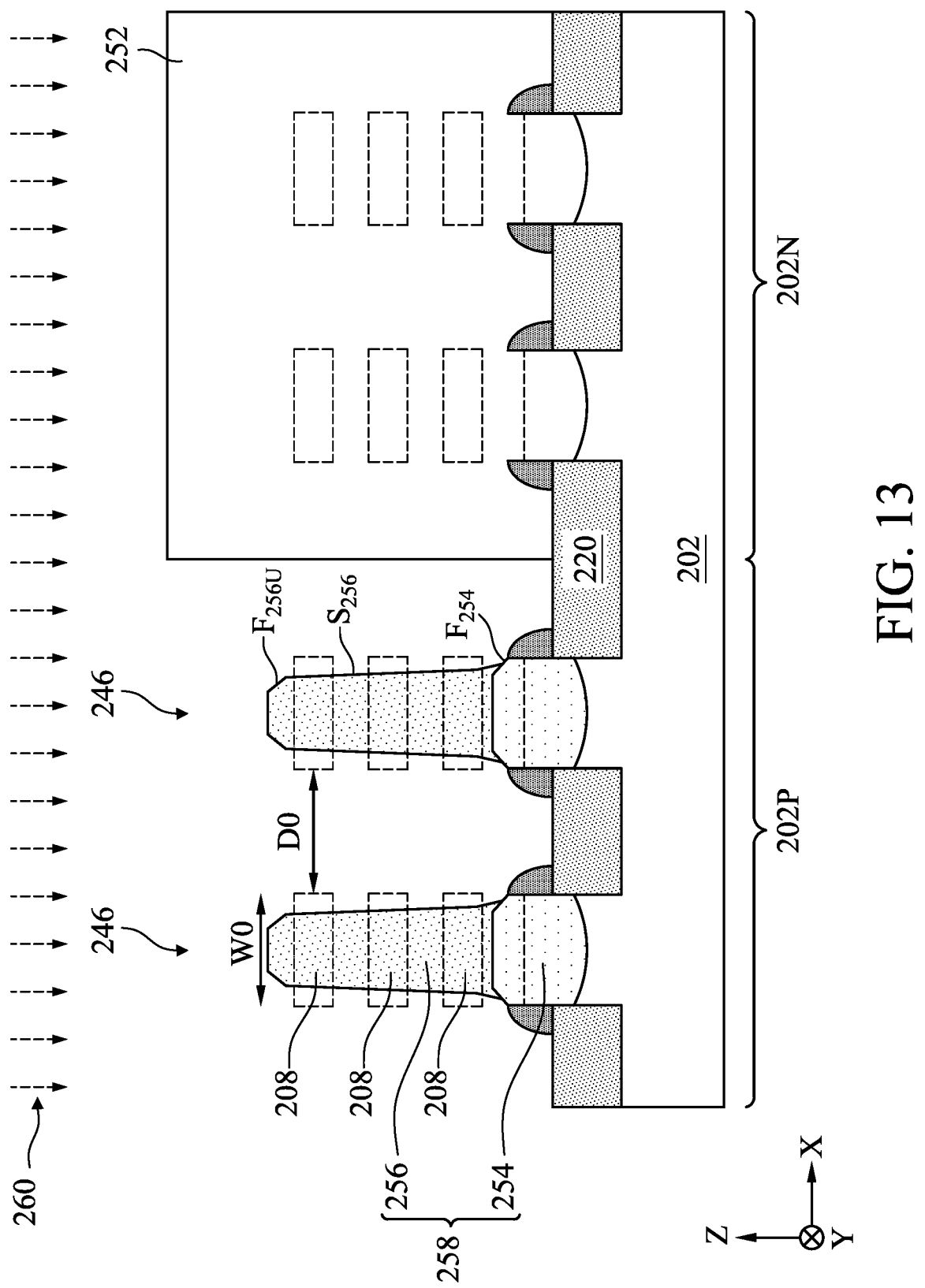

Referring to FIG. 12, at operation 122, the method 100 (FIG. 1) modifies the shape of the S/D features 258 through an S/D etch-back process 260. The profile of the S/D features 258 is reshaped and its volume is reduced. In some embodiments, it is the upper epitaxial layer 256 being reshaped, and the buffer epitaxial layer 254 remains intact. The etch-back process 260 is a selective etching process. The selective etching process may include wet etching, dry etching, reactive ion etching, or other suitable etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF), potassium hydroxide (KOH) solution, tetramethylazanium hydroxide (TMAH), SC1, ammonia, a solution containing hydrofluoric acid (HF), nitric acid ($HNO_3$), and/or acetic acid ($CH_3COOH$), or other suitable wet etchants. In one example, the selective etching process applies an SC1-containing etchant (e.g., a mixture of $NH_4OH$, $H_2O_2$, $H_2O$ in a ratio of 2:1:20) under a temperature from about 600° C. to about 700° C. The etchant reacts with the exposed surfaces of the S/D features 258 (upper epitaxial layer 256) and reshapes the S/D features 258.

The S/D etch-back process (or S/D reshape process) 260 may recess the S/D features 258 for about 1 nm to about 10 nm, in some embodiments. By recessing the S/D features 258, the volume of the S/D features 258 is also reduced, leading to smaller parasitic capacitance. Further, the external surfaces of the S/D features 258 are modified. For example, the upper facets (upward-facing facets) $F_{256U}$ are reduced in sizes. Beside the shrinking of the upper facets $F_{256U}$, the lower facets (downward-facing facets) $F_{256L}$ may be removed and replaced by a none-crystalline sidewall 5256. The non-crystalline sidewall $S_{256}$ may be substantially vertical to the top surface of the substrate 202 or have a small tapering profile forming an angle between 80° to 90° with respect to the top surface of the substrate 202. In furtherance of embodiments, the upper facets $F_{256U}$ may also be removed and replaced by non-crystalline surfaces, such as rounded corners.

The S/D etch-back process 260 also trims down the width of the S/D features 258. The height of the S/D features 258 is larger than its width (a higher aspect ratio). A width W2 measured at half of the height of the S/D feature 258 may be about 5 nm to about 35 nm smaller than W1 (FIG. 11). A ratio of W2 and W0 may range from about 0.8 to about 1.2, and a difference between W2 and W0 (W2−W0) may range from about −10 nm to about 10 nm. The ranges are not trivial. If the ratio is larger than about 1.2 (or W2−W0>10 nm), the parasitic capacitance reduction may be insignificant and still hinder the circuit speed (e.g., in a ring oscillator circuit, the speed improvement is insignificant compared to without performing the S/D etch-back process). If the ratio is less than about 0.8 (or W2−W0<−10 nm), the volume of the S/D feature 258 becomes so small that resistance introduced by the S/D feature 258 increases and offsets the parasitic capacitance reduction (e.g., in a ring oscillator circuit, the RC constant adversely increases due to a larger R even though C is smaller). The width trimming also increases lateral distance between adjacent S/D features 258, which is enlarged from D1 (FIG. 11) to D2. If the adjacent S/D features 258 have merged at the conclusion of operation 120, the S/D etch-back process 260 removes the connecting epitaxial portion between the adjacent S/D features 258 and enlarges the lateral distance therebetween. The enlarged lateral distance D2 may range from about 20 nm to about 60 nm and may be larger than lateral distance DO between adjacent channel layers 208 (D2>D0), in some embodiments.

Due to the width reduction of the S/D features 258, a width of the top portion of the upper epitaxial layer 256 becomes smaller than the channel layer width W0. Consequently, at least a portion of the sidewall (in X-Z plane) of the topmost channel layer 208 is exposed in the S/D recesses 246. In the illustrated embodiment, the edge portions of the topmost channel layer 208 (represented by the topmost dashed box in FIG. 12) are exposed and the middle portion of the topmost channel layer 208 remains covered by the upper epitaxial layer 256 of the S/D features 258. The sidewall $S_{256}$ of the upper epitaxial layer 256 may have a tapering profile, such that closer to the buffer epitaxial layer 254 the upper epitaxial layer 256 has a larger width. As a result, the channel layers 208 closer to the bottom have sidewalls less exposed. In one example, all the channel layers 208 have some edge portions exposed in the S/D recesses 246. In another example, at least the bottommost channel layer 208 remains fully covered by the upper epitaxial layer 256. The width reduction of the S/D features 258 also partially exposes the inner spacers 250 that are vertically stacked between the channel layers 208.

In the embodiment illustrated in FIG. 12, the bottom portion of the upper epitaxial layer 256 is wider than the channel layer width W0 and still fully covers the buffer epitaxial layer 254. In an alternative embodiment illustrated in FIG. 13, the bottom portion of the upper epitaxial layer 256 becomes narrower than the channel layer width W0, and consequently not only all the channel layers 208 have some edge portions exposed in the S/D recesses 246, but also the buffer epitaxial layer 254, such as at least a portion of the facet $F_{254}$. For the convenience of discussion, the embodiment in FIG. 12 with the buffer epitaxial layer 254 remaining covered is used as an example for subsequent operations. Persons having ordinary skill in the art should recognize that the embodiment in FIG. 13 with the buffer epitaxial layer 254 partially exposed can also be used for the subsequent operation.

Figure 14:
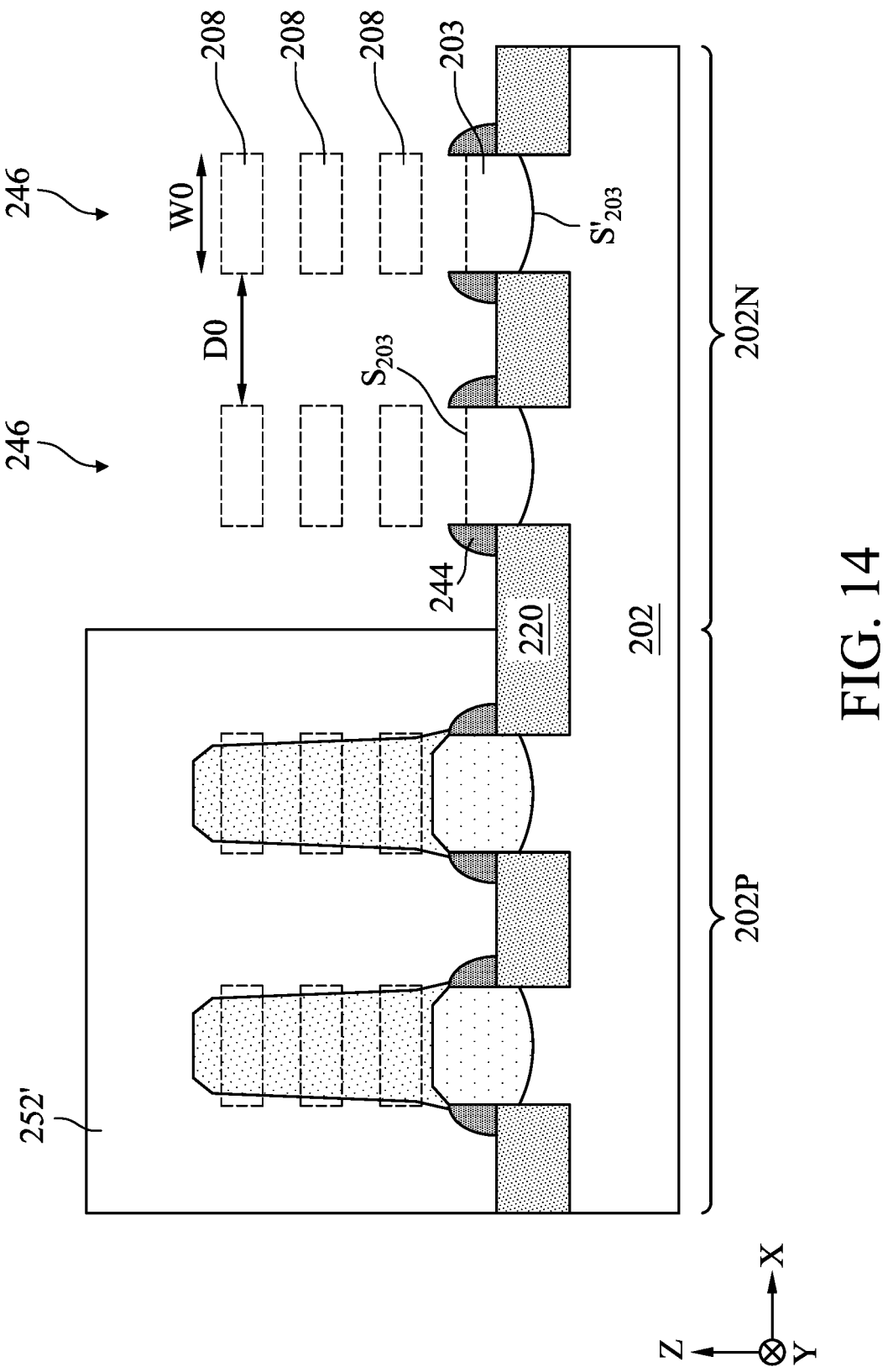

Referring to FIG. 14, at operation 124, the method 100 (FIG. 1) removes the patterned mask layer 252 from the NFET region 202N and deposits a patterned mask layer 252' covering the PFET region 202P. The patterned mask layer 252' is substantially similar to what has been discussed above in association with the patterned mask layer 252, in some embodiments. In one example, the patterned mask layer 252' is a hard mask layer comprising a single layer or a multi-layer. In another example, the patterned mask layer 252' is a resist layer, such as a tri-layer resist layer.

Figure 15:
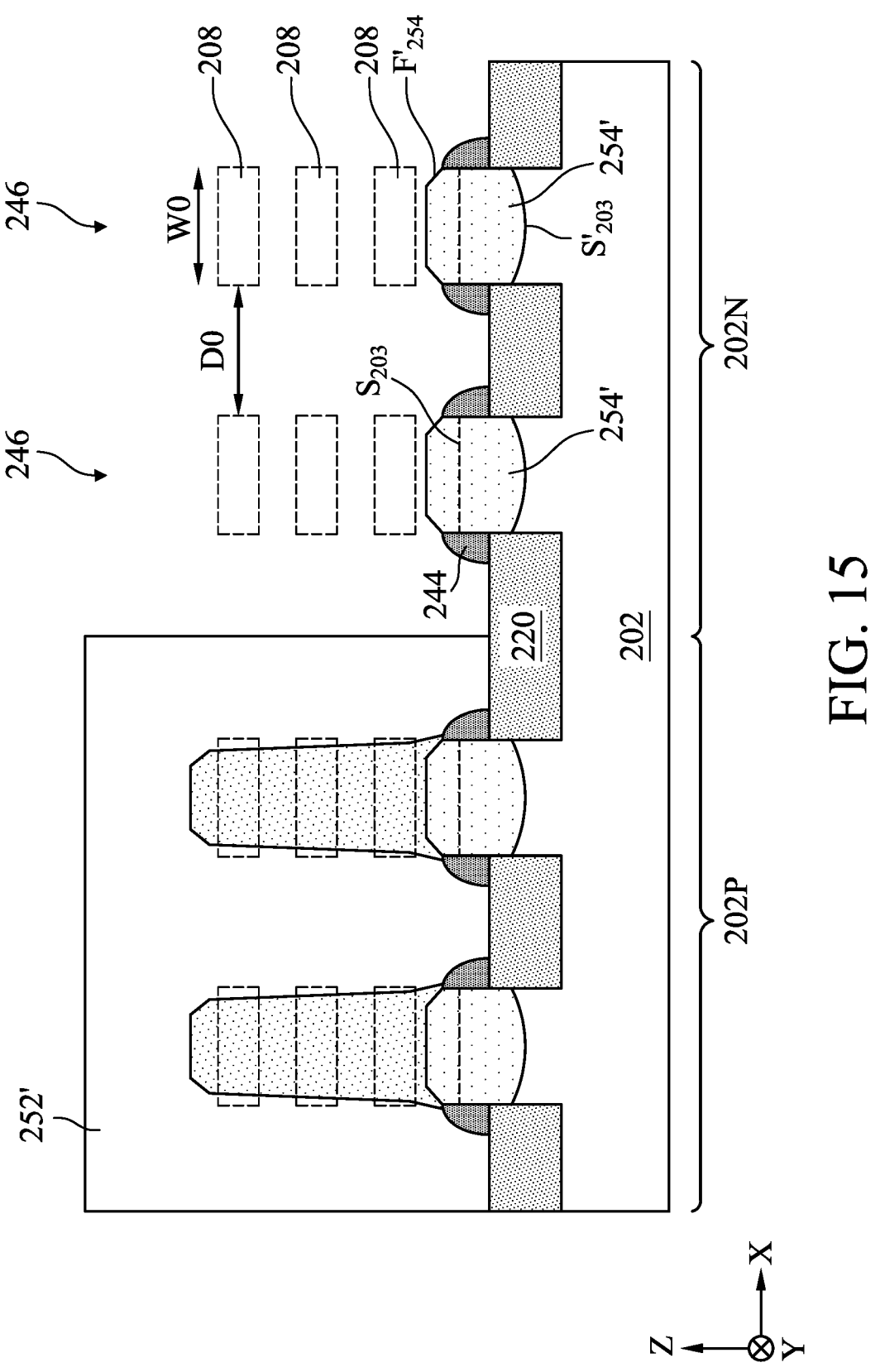

Referring to FIG. 15, at operation 126, the method 100 (FIG. 1) forms a buffer epitaxial layer 254' at the bottom of the S/D recesses 246 in the NFET region 202N. The buffer epitaxial layer 254' is epitaxially grown from the recessed top surface S'203 of the base portion 203 in the S/D regions. The buffer epitaxial layer 254' may also be referred to as the lower epitaxial layer 254'. By way of example, epitaxial growth of the buffer epitaxial layer 254' may be performed by vapor-phase epitaxy (VPE), ultra-high vacuum CVD (UHV-CVD), molecular beam epitaxy (MBE), and/or other suitable processes. In some embodiments, the buffer epitaxial layer 254' include the same material as the substrate 202, such as silicon (Si). In some alternative embodiments, the buffer epitaxial layer 254' includes a different semiconductor material than the Si substrate 202, such as SiP, SiAs, SiC, SiCP, SiCAs, or other suitable semiconductor material. In some embodiments, the buffer epitaxial layer 254' is dopant-free, where for example, no intentional doping is performed during the epitaxial growth process. As a comparison, in one instance, the substrate 202 is lightly doped and has a higher doping concentration than the buffer epitaxial layer 254'. The buffer epitaxial layer 254' provides a high resistance path from the S/D regions to the semiconductor substrate, such that the leakage current in the semiconductor substrate (i.e., through the base portion 203) is suppressed. Alternatively, the buffer epitaxial layer 254' may be slightly doped with dopants such as arsenic (As) or phosphorus (P) with a molar concentration from about $2\times10^{20}$ cm$^{-3}$ to about $1\times10^{21}$ cm$^{-3}$. In another example, the dopant is carbon (C) with a carbon atomic percentage from about 1% to about 10%. In some embodiments, the buffer epitaxial layer 254' include the same semiconductor material as the buffer epitaxial layer 254, such as undoped silicon (Si). In some embodiments, the buffer epitaxial layer 254' and the buffer epitaxial layer 254 include different semiconductor materials.

The fin sidewall spacers 244 limit the lateral growth of the buffer epitaxial layer 254' within opposing inner sidewalls of the fin sidewall spacers 244. The buffer epitaxial layer 254' exhibits faceted growth when it raises above the fin sidewall spacers 244. FIG. 15 illustrates facets F'254 at the upper portion of the buffer epitaxial layer 254'. The growth of the buffer epitaxial layer 254' is under time control such that the top surface of the buffer epitaxial layer 254' is above the top surface S$_{203}$ of the base portion 203 in the channel region and also partially overlaps with a bottommost inner spacer 250 (between the bottommost epitaxial layer 208 and the base portion 203 in the channel region). The bottommost inner spacer 250 is interposed between the buffer epitaxial layer 254 and the bottommost epitaxial layer 206. The buffer epitaxial layer 254' is in physical contact with a lower portion of the bottommost inner spacer 250. The vertical sidewall (in X-Z plane) of the base portion 203 in the channel region (as exposed in the S/D recesses 246) is in physical contact with and fully covered by the buffer epitaxial layer 254'. The buffer epitaxial layer 254' protects the base portion 203 in the channel region from dopant diffusion when an upper S/D epitaxial layer with a higher dopant concentration is subsequently formed in the S/D recesses 246.

Figure 16:
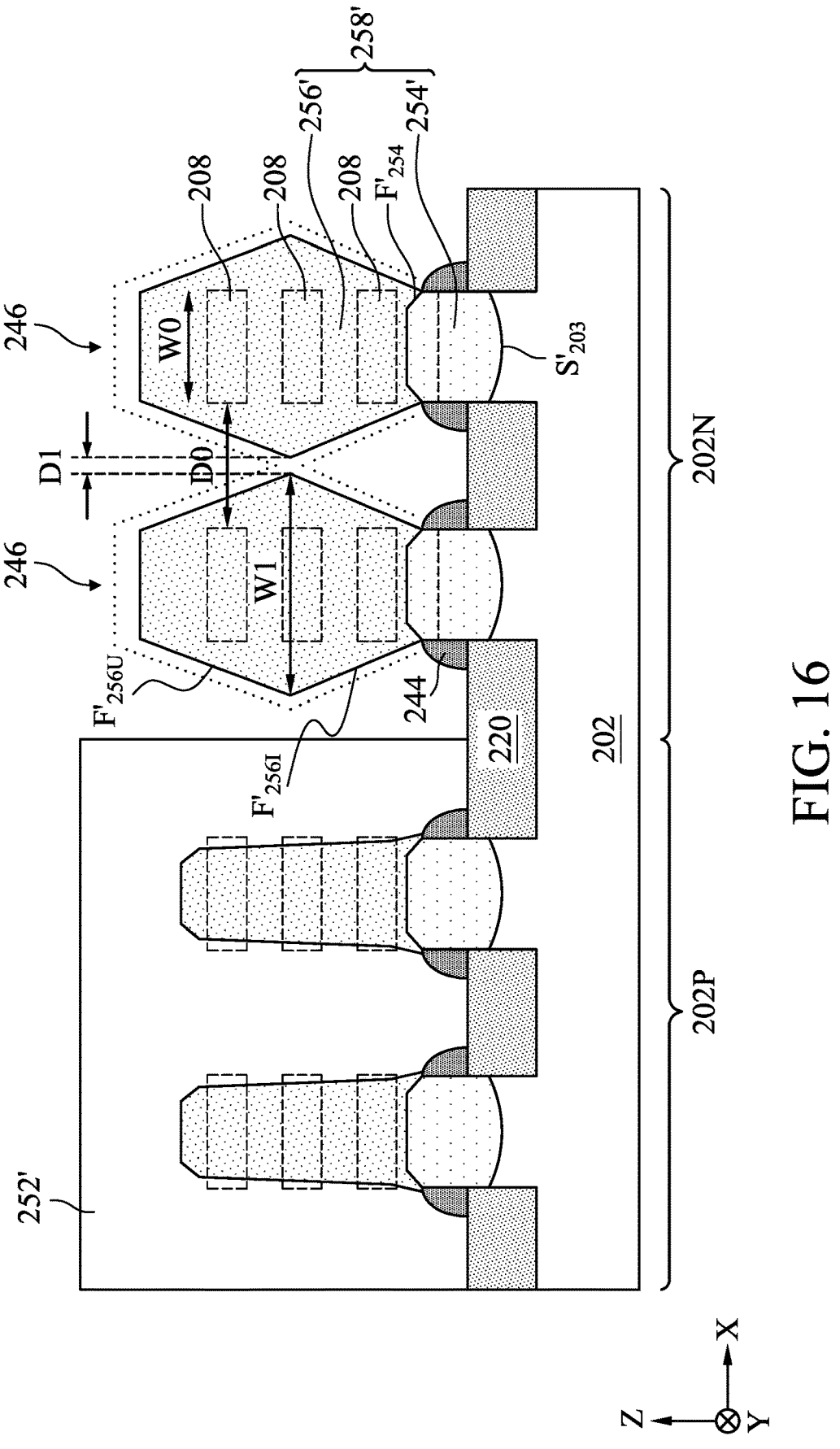

Referring to FIG. 16, at operation 128, the method 100 (FIG. 1) forms upper epitaxial layer 256' on the buffer epitaxial layer 254' in each of the S/D recesses 246 in the NFET region 202N. The upper epitaxial layer 256' and the buffer epitaxial layer 254' (or lower epitaxial layer 254') in each of the S/D recesses 246 collectively define an n-type S/D epitaxial feature 258' (or n-type S/D feature 258'). By way of example, epitaxial growth of the upper epitaxial layer 256' may be performed by vapor-phase epitaxy (VPE), ultra-high vacuum CVD (UHV-CVD), molecular beam epitaxy (MBE), and/or other suitable processes. The upper epitaxial layer 256' may include Si, SiP, SiAs, SiC, SiCP, SiCAs, or other suitable semiconductor material. The upper epitaxial layer 256' may be doped with dopants such as arsenic (As) or phosphorus (P). Generally, the upper epitaxial layer 256' includes higher dopant concentration than the buffer epitaxial layer 254'. In one example, the upper epitaxial layer 256' is doped with As or P with a molar concentration from about $5\times10^{20}$ cm$^{-3}$ to about $4\times10^{21}$ cm$^{-3}$. When the upper epitaxial layer 256' includes carbon, a carbon atomic percentage may range from about 10% to about 20%. In some embodiments, the upper epitaxial layer 256' includes the same semiconductor material with the buffer epitaxial layer 254' but with a higher dopant concentration. For example, the upper epitaxial layer 256' and the buffer epitaxial layer 254' may both include silicon doped with phosphorus (e.g., SiP), while the upper epitaxial layer 256' includes higher concentrations of phosphorus than the buffer epitaxial layer 254'. The upper epitaxial layer 256' has the same crystalline orientation with the substrate 202 and the buffer epitaxial layer 254'. In the illustrated embodiment, the upper epitaxial layer 256' has upper facets (upward-facing facets) F'$_{256U}$ and lower facets (downward-facing facets) F'$_{256L}$. The facets F'$_{256U}$ and F'$_{256L}$ may have a (111) crystalline orientation or a (110) crystalline orientation.

The upper epitaxial layer 256' is formed in S/D regions adjacent to and on both sides of the dummy gate structure 234. For example, the upper epitaxial layers 256' is in contact with the inner spacers 250 and the channel layers 208 (epitaxial layers 208). The growth of the upper epitaxial layer 256' is under time control such that the top surface of the upper epitaxial layer 256' is above the top surface of the topmost channel layer 208, and the width of the upper epitaxial layer 256' is larger than the width W0 of the channel layer 208, such that the upper epitaxial layer 256' fully covers sidewalls (in X-Z plane) of each of the epitaxial layers 208. In other words, no channel layer 208 is exposed in the S/D recesses 246 after being covered by the upper epitaxial layer 256'. The bottom portion of the upper epitaxial layer 256' is in contact with the fin sidewall spacers 244 and fully covers the top surface of the buffer epitaxial layer 254', including the facets F'254 of the buffer epitaxial layer 254', but is separated from the base portion 203. In other words, the buffer epitaxial layer 254' fully covers sidewalls (in X-Z plane) of the base portion 203 with sufficient margin, such that the upper epitaxial layer 256' is separated from the base portion 203 by the buffer epitaxial layer 254' for a distance that is sufficient to prevent dopants of high concentration diffusing into the base portion 203. This configuration helps mitigating substrate current leakage.

In some embodiments, a ratio of the largest width W1 of the upper epitaxial layer 256' and the width W0 of the channel layer 208 is larger than about 1.2:1, and a difference between W1 and W0 (W1–W0) ranges from about 10 nm to about 25 nm. In some embodiments, a lateral distance D1 between adjacent upper epitaxial layers 256 ranges from about 5 nm to 40 nm. In some embodiments, the growth of the upper epitaxial layer 256' is under time control such that adjacent upper epitaxial layer 256' connect with each other and merge into one larger upper epitaxial layer 256', such as represented by the dotted contour in FIG. 16.

Figure 17:
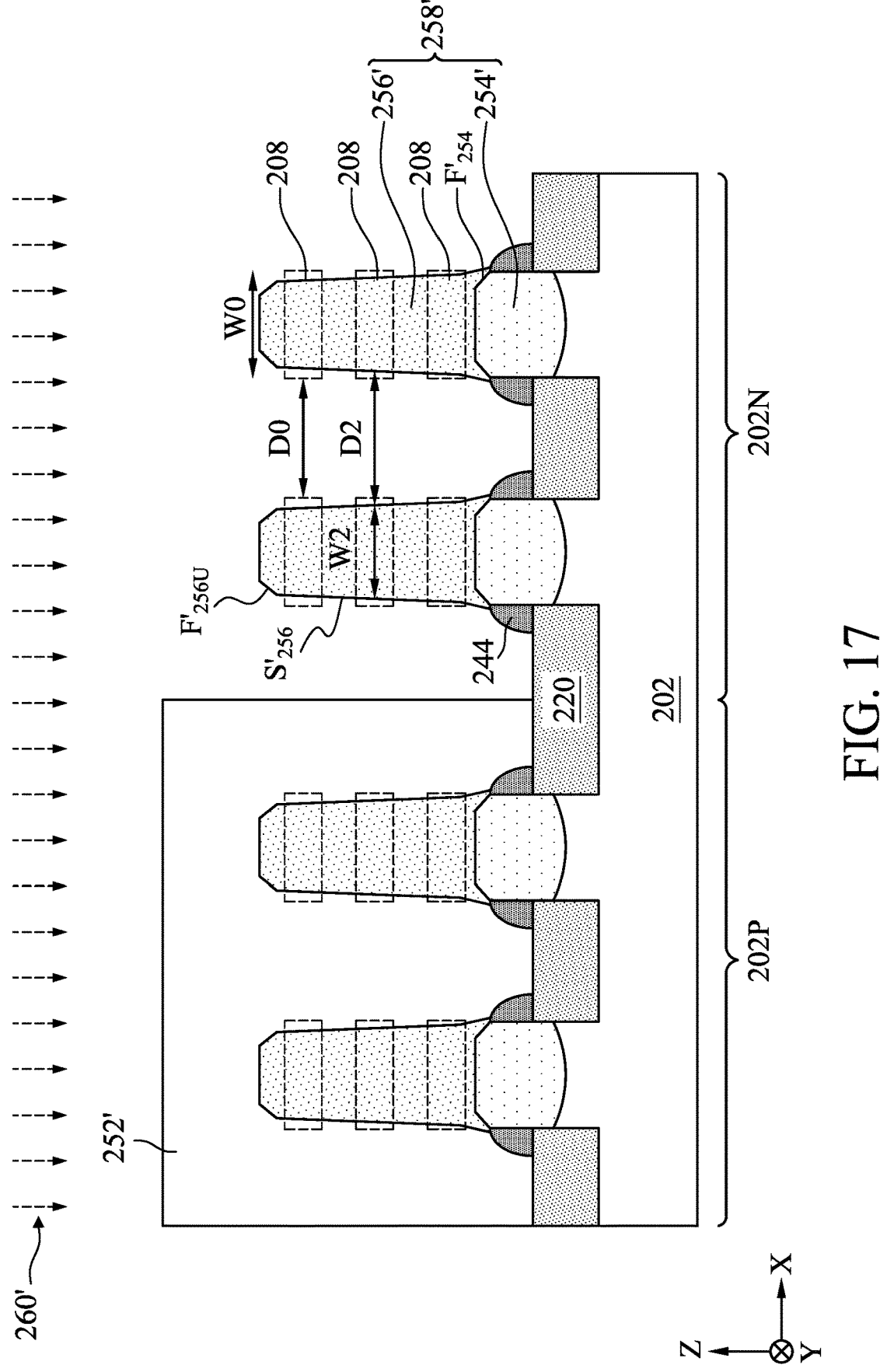

Referring to FIG. 17, at operation 130, the method 100 (FIG. 1) modifies the shape of the S/D features 258' through an S/D etch-back process 260'. The profile of the S/D features 258' is reshaped and its volume is reduced. In some embodiments, it is the upper epitaxial layer 256' being reshaped, and the buffer epitaxial layer 254' remains intact. The etch-back process 260' is a selective etching process. The etch-back process 260' is substantially similar to what has been discussed above in association with the etch-back process 260, in some embodiments.

The S/D etch-back process (or S/D reshape process) 260' may recess the S/D features 258' for about 1 nm to about 10 nm in some embodiments. By recessing the S/D features 258', the volume of the S/D features 258' is also reduced, leading to smaller parasitic capacitance. Further, the external surfaces of the S/D features 258' are modified. For example, the upper facets (upward-facing facets) F'$_{256U}$ are reduced in sizes. Beside the shrinking of the upper facets F'$_{256U}$, the lower facets (downward-facing facets) F$_{256L}$ may be removed and replaced by a none-crystalline sidewall S'256. The non-crystalline sidewall S'$_{256}$ may be substantially vertical to the top surface of the substrate 202 or have a small tapering profile forming an angle between 80° to 90° with respect to the top surface of the substrate 202. In furtherance of embodiments, the upper facets F'$_{256U}$ may also be removed and replaced by non-crystalline surfaces, such as rounded corners.

The S/D etch-back process 260' also trims down the width of the S/D features 258'. The height of the S/D features 258' is larger than its width (a higher aspect ratio). A width W2 measured at half of the height of the S/D feature 258' may be about 5 nm to about 35 nm smaller than W1 (FIG. 16). A ratio of W2 and W0 may range from about 0.8 to about 1.2, and a difference between W2 and W0 (W2−W0) may range from about −10 nm to about 10 nm. The ranges are not trivial. If the ratio is larger than about 1.2 (or W2−W0>10 nm), the parasitic capacitance reduction may be insignificant and still hinder the circuit speed (e.g., in a ring oscillator circuit, the speed improvement is insignificant compared to without performing the S/D etch-back process). If the ratio is less than about 0.8 (or W2−W0<−10 nm), the volume of the S/D feature 258' becomes so small that resistance introduced by the S/D feature 258' increases and offsets the parasitic capacitance reduction (e.g., in a ring oscillator circuit, the RC constant adversely increases due to a larger R even though C is smaller). The width trimming also increases lateral distance between adjacent S/D features 258', which is enlarged from D1 (FIG. 16) to D2. If the adjacent S/D features 258' have merged at the conclusion of operation 128, the S/D etch-back process 260' removes the connecting epitaxial portion between the adjacent S/D features 258' and enlarges the lateral distance therebetween. The enlarged lateral distance D2 may range from about 20 nm to about 60 nm and may be larger than lateral distance D0 between adjacent channel layers 208 (D2>D0), in some embodiments.

Due to the width reduction of the S/D features 258', a width of the top portion of the upper epitaxial layer 256' is smaller than the channel layer width W0, and consequently at least a portion of the sidewall (in X-Z plane) of the topmost channel layer 208 is exposed in the S/D recesses 246. In the illustrated embodiment, the edge portions of the topmost channel layer 208 (represented by the topmost dashed box in FIG. 17) are exposed and the middle portion of the topmost channel layer 208 remains covered by the upper epitaxial layer 256' of the S/D features 258'. The sidewall S'$_{256}$ of the upper epitaxial layer 256' may have a tapering profile, such that closer to the buffer epitaxial layer 254' the upper epitaxial layer 256' has a larger width. As a result, the channel layers 208 closer to the bottom have sidewalls less exposed. In one example, all the channel layers 208 have some edge portions exposed in the S/D recesses 246. In another example, at least the bottommost channel layer 208 remains fully covered by the upper epitaxial layer 256'. The width reduction of the S/D features 258' also partially exposes the inner spacers 250 that are vertically stacked between the channel layers 208.

Figure 18:
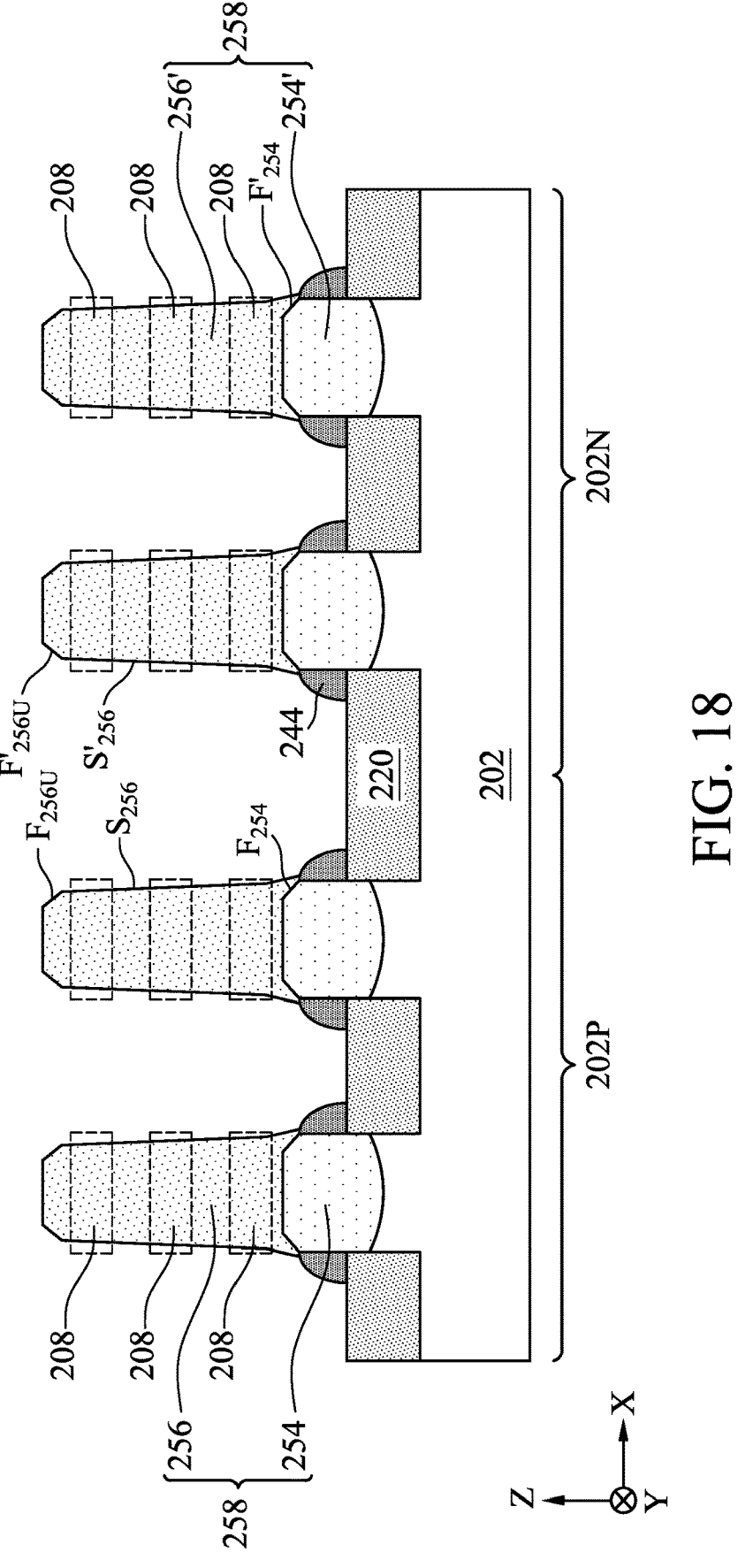
Figure 19:
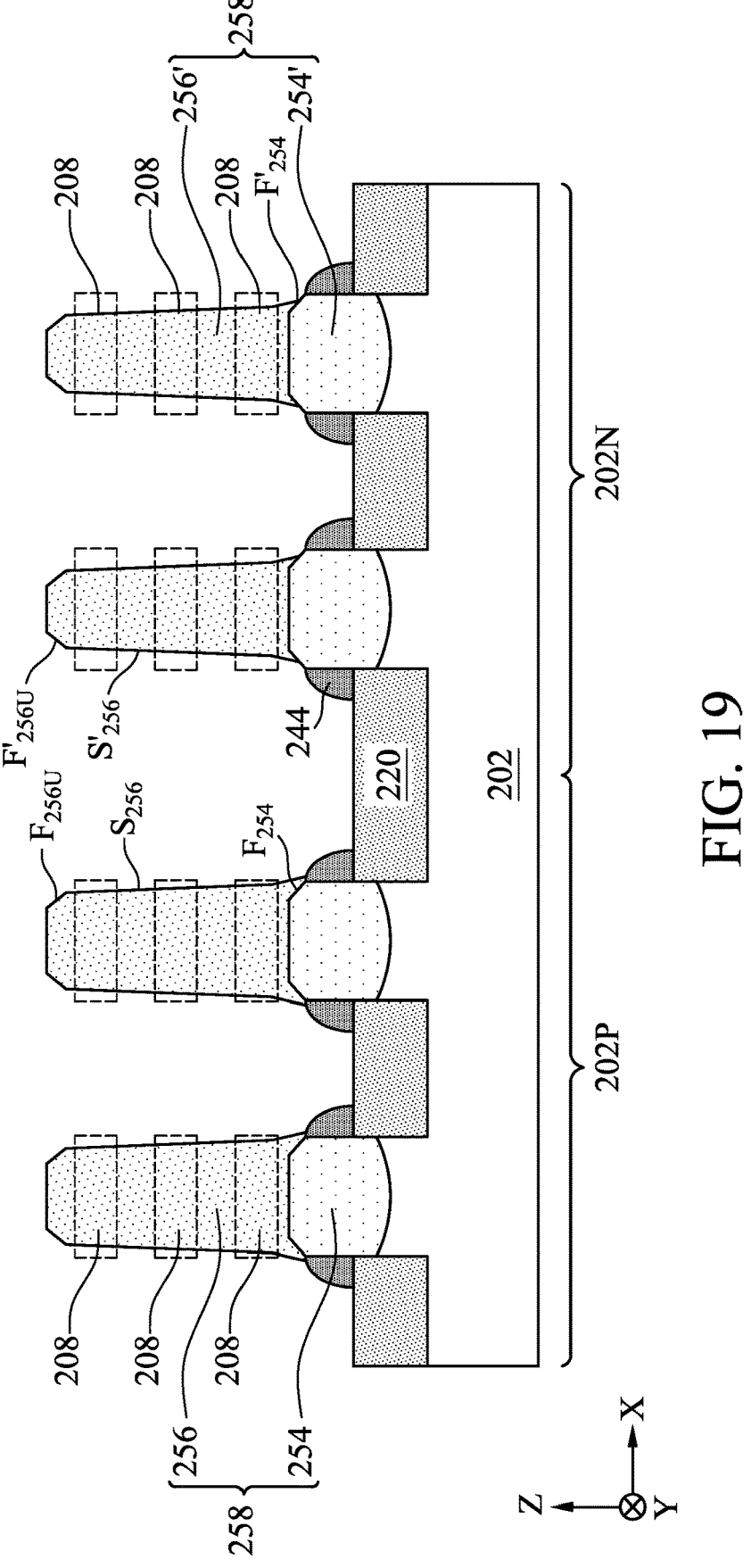

At the conclusion of the operation 130, the patterned mask layer 252' is removed in an etching process or an ashing process in exposing the PFET region 202P. The resultant structure is shown in FIG. 18, in which the S/D features in both the PFET region 202P and the NFET region 202N are exposed. In the embodiment illustrated in FIG. 18, the bottom portion of the upper epitaxial layer 256' is wider than the channel layer width W0 and fully covers the buffer epitaxial layer 254'. In an alternative embodiment illustrated in FIG. 19, the bottom portion of the upper epitaxial layer 256' is narrower than the channel layer width W0, and consequently not only all the channel layers 208 have some edge portions exposed in the S/D recesses 246', but also the buffer epitaxial layer 254', such as at least a portion of the facets F'254. In furtherance of embodiments, the buffer epitaxial layer 254 in the PFET region 202P may remain fully covered by the upper epitaxial layer 256, while the buffer epitaxial layer 254' in the NFET region 202N is partially exposed due to the need of having smaller S/D features in the NFET transistors to fit higher speed requirement.

For the convenience of discussion, the embodiment in FIG. 18 with the buffer epitaxial layer 254 and the buffer epitaxial layer 254' remaining covered is used as an example for subsequent operations. Persons having ordinary skill in the art should recognize that the embodiment in FIG. 19 with the buffer epitaxial layer 254' and/or the buffer epitaxial layer 254 partially exposed can also be used for the subsequent operation.

Further, in the embodiments discussed above, the p-type S/D features 258 and the n-type S/D features 258' are separately reshaped at operations 122 and 130, respectively. In some alternative embodiments, operations 122 and 130 may be combined as one S/D reshape process performed after the operation 128 to etch back the p-type S/D 258 and the n-type S/D feature 258' at the same time.

Still further, in the embodiments discussed above, the buffer epitaxial layer 254 in the PFET region 202P and the buffer epitaxial layer 254' in the NFET region 202N are formed separately at operations 118 and 126, respectively. In some alternative embodiments, operations 118 and 126 may be combined as one operation in epitaxially growing the buffer epitaxial layer in the PFET regions 202P and the NFET region 202N at the same time prior to operation 116, particularly when the buffer epitaxial layer in the PFET and NFET regions includes the same material composition (e.g., undoped silicon).

Figure 20:
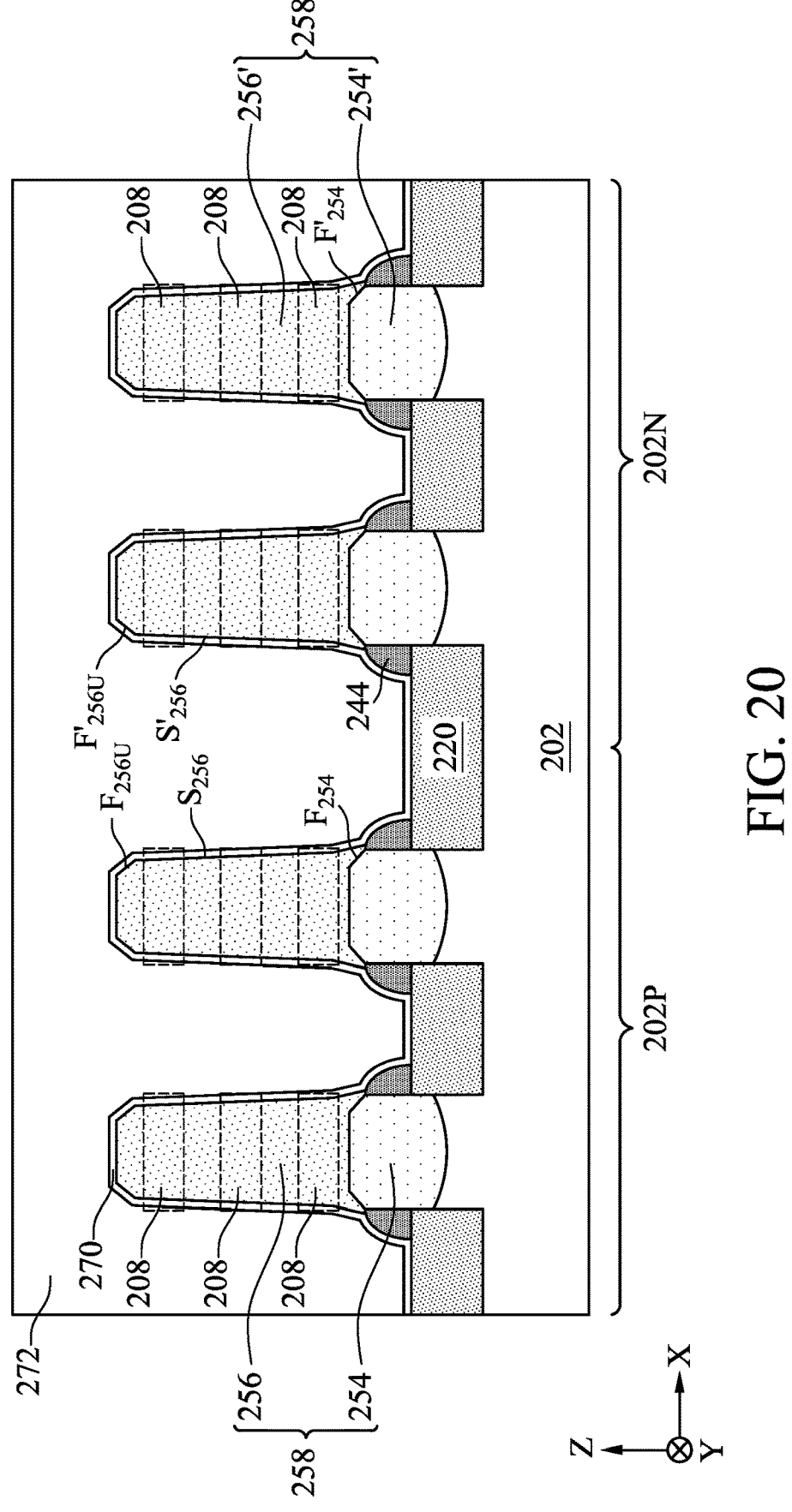
Figure 21:
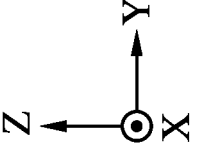

Referring to FIG. 20, at operation 132, the method 100 (FIG. 1) forms a contact etch stop layer (CESL) 270 and an inter-layer dielectric (ILD) layer 272. The CESL 270 is deposited over the upper epitaxial layers 256/256', the fin sidewall spacers 244, and the gate sidewall spacers 242, and the ILD layer 272 is deposited over the CESL 270. If the facets F$_{254}$ and/or F'$_{254}$ are exposed at the conclusion of the operation 130, the CESL 270 is also deposited on exposed portions of the facets F$_{254}$ and/or F'$_{254}$. In some embodiments, the CESL 270 includes a silicon nitride layer, silicon oxide layer, a silicon oxynitride layer, and/or other materials known in the art. The CESL 270 may be formed by plasma-enhanced chemical vapor deposition (PECVD) process and/or other suitable deposition or oxidation processes. In some embodiments, the ILD layer 272 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 272 may be deposited by a PECVD process or other suitable deposition technique. In some embodiments, after formation of the ILD layer 272, the device 200 may be subject to a high thermal budget process to anneal the ILD layer 272.

As discussed, the reshaped S/D features 258/258' partially expose the sidewalls of at least some top channel layers 208. Accordingly, the CESL 270 is also in physical contact with the exposed sidewalls (in X-Z plane) of at least some channel layers 208. Depending on the sizes of the exposed sidewalls of the channel layers 208 and the thickness of the CESL 270, a portion of the exposed sidewalls of the channel layers 208 may also be in physical contact with the ILD layer 272, particularly for the top channel layers 208 with larger exposed sidewalls. In one example, at least the topmost channel layer 208 has edge portions of the sidewall in physical contact with the CESL 270 and the ILD layer 272, at least the bottommost channel layer 208 is fully covered by the upper epitaxial layer 256/256' and not in physical contact with either the CESL 270 and the ILD layer 272, and at least one middle channel layer 208 is in physical contact with the CESL 270 but not with the ILD layer 272. In another example, at least the topmost channel layer 208 has edge portions of the sidewall in physical contact with the CESL 270 and the ILD layer 272, and at least the bottommost channel layer 208 has edge portions of the sidewall in physical contact with the CESL 270 but not with the ILD layer 272. In yet another example, each of the channel layers 208 has edge portions of the sidewall in physical contact with the CESL 270 and the ILD layer 272.

After depositing the ILD layer 272, a planarization process may be performed to remove excessive dielectric materials. For example, a planarization process includes a chemical mechanical planarization (CMP) process which removes portions of the ILD layer 272 (and the CESL 270, if present) overlying the dummy gate structure 234 and planarizes a top surface of the device 200. In some embodiments, the CMP process also removes the hard mask 236 and exposes the dummy electrode layer of the dummy gate structure 234 (FIG. 8A).

At operation 134, the method 100 (FIG. 1) replaces the dummy gate structure 234 with a high-k metal gate (HK MG) stack. The resultant structure is shown in FIG. 21, which is a cross-sectional view of the device 200 as in FIG. 8A taken in the Y-Z plane along the III-III line at the conclusion of the operation 134. In some embodiments, operation 134 may include one or more etching processes that remove the dummy gate structure 234 in forming a gate trench. For example, the removal of the dummy gate structure 234 may be performed using a selective etch process such as a selective wet etch, a selective dry etch, or a combination thereof. Operation 134 also removes the epitaxial layers 206 from the gate trench. In an embodiment, the epitaxial layers 206 include SiGe and the epitaxial layers 208 are silicon, allowing for the selective removal of the epitaxial layers 206. In an embodiment, the epitaxial layers 206 are removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by $O_3$ clean and then SiGeOx removed by an etchant such as $NH_4OH$. Subsequently, the operation 134 forms a HK MG stack 280 in the gate trench.

In some embodiments, the HK MG stack 280 includes an interfacial layer (not shown), a high-K gate dielectric layer 282 formed over the interfacial layer, and a gate electrode layer 284 formed over the high-k gate dielectric layer 282. High-k gate dielectrics, as used and described herein, include dielectric materials having a high dielectric constant, for example, greater than that of thermal silicon oxide (~3.9). The gate electrode layer used within HK MG stack may include a metal, metal alloy, or metal silicide. Additionally, the formation of the HK MG stack may include depositions to form various gate materials, one or more liner layers, and one or more CMP processes to remove excessive gate materials and thereby planarize a top surface of the device 200.

Interposing the HK MG stack 280 and the S/D features 258/258' are the inner spacers 250, providing isolation. The structure of the HK MG stack 280, the S/D features 258/258', and the inner spacers 250 therebetween forms a parasitic capacitor. Without the S/D reshape process, the effective surface area of the parasitic capacitor is relatively large.

As a comparison, by reshaping the S/D features, the effective surface area of the parasitic capacitor is reduced. Consequently, the amount of parasitic capacitance is reduced.

The HK MG stack 280 includes portions that interpose and wrap around each of the epitaxial layers (channel layers, or channel members) 208, which form channels of the multi-gate device 200. In some embodiments, the interfacial layer of the HK MG stack 280 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k gate dielectric layer 282 of the HK MG stack 280 may include a high-K dielectric such as hafnium oxide ($HfO_2$). Alternatively, the high-k gate dielectric layer 282 of the HK MG stack 280 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-k gate dielectric layer 282 may be formed by ALD, physical vapor deposition (PVD), CVD, oxidation, and/or other suitable methods.

The gate electrode layer 284 of the HK MG stack 280 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 284 of HK MG stack 280 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer 284 of the HK MG stack 280 may be formed by ALD, PVD, CVD, e-beam evaporation, or other suitable process. Further, the gate electrode layer 284 may be formed separately for NFET and PFET transistors which may use different metal layers (e.g., for providing an n-type or p-type work function).

The device 200 may undergo further processing to form various features and regions known in the art. For example, subsequent processing may form contact openings, contact metal, as well as various contacts/vias/lines and multilayers interconnect features (e.g., metal layers and interlayer dielectrics), configured to connect the various features to form a functional circuit that may include one or more multi-gate devices. In furtherance of the example, a multi-layer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

One of ordinary skill may recognize although FIGS. 2A-21 illustrate GAA devices as embodiments, other examples of semiconductor devices may benefit from aspects of the present disclosure, such as FinFET devices. In FinFET devices, the semiconductor fin 210 with essentially uniform and continuous semiconductor material provides a channel region for a transistor other than the vertically stacked channel layers as in GAA devices. Similarly, the reshaped S/D features also reduces parasitic capacitance and suppresses leakage in FinFET devices.

Although not intended to be limiting, one or more embodiments of the present disclosure provide many benefits to a semiconductor device and the formation thereof. For example, embodiments of the present disclosure provide S/D reshape process(es). The S/D reshape process modifies the shape of S/D epitaxial features, which reduces volumes of S/D epitaxial features and consequently parasitic capacitance between S/D contacts and metal gate stacks. The leakage between S/D contacts and metal gate stacks is also suppressed. Furthermore, the S/D reshape process can be easily integrated into existing semiconductor fabrication processes.

In one exemplary aspect, the present disclosure is directed to a method. The method includes forming a semiconductor fin protruding from a substrate, depositing an isolation feature on sidewalls of the semiconductor fin, forming a dummy gate structure across the semiconductor fin, recessing the semiconductor fin in a region adjacent the dummy gate structure to form a recess, an end of the semiconductor fin under the dummy gate structure being exposed in the recess, growing an epitaxial feature in the recess and in physical contact with the isolation feature, the epitaxial feature covering the end of the semiconductor fin from being exposed in the recess, trimming the epitaxial feature to reduce a width of the epitaxial feature, such that a portion of the end of the semiconductor fin is exposed again in the recess, a height of the epitaxial feature being larger than the reduced width of the epitaxial feature, depositing a dielectric layer on the epitaxial feature, the dielectric layer being in physical contact with the exposed portion of the end of the semiconductor fin, and replacing the dummy gate structure with a metal gate structure. In some embodiments, the trimming of the epitaxial feature also reduces the height of the epitaxial feature. In some embodiments, the epitaxial feature with the reduced height is still above a topmost portion of the semiconductor fin. In some embodiments, after the growing of the epitaxial feature, the epitaxial feature includes a first crystalline surface, and the trimming of the epitaxial feature reduces a size of the first crystalline surface. In some embodiments, after the growing of the epitaxial feature, the epitaxial feature includes a second crystalline surface below the first crystalline surface, and the trimming of the epitaxial feature replaces the second crystalline surface with a non-crystalline surface. In some embodiments, the portion of the end of the semiconductor fin is a top portion of the semiconductor fin, and after the trimming of the epitaxial feature, a bottom portion of the semiconductor fin remains fully covered by the epitaxial feature. In some embodiments, the growing of the epitaxial feature includes growing a first epitaxial layer in the recess, and growing a second epitaxial layer on the first epitaxial layer, the second epitaxial layer fully covering a top surface of the first epitaxial layer. In some embodiments, the trimming of the epitaxial feature exposes a portion of the top surface of the first epitaxial layer. In some embodiments, the method further includes forming a spacer layer interposing the epitaxial feature and the dummy gate structure, after the trimming of the epitaxial feature, a portion of the spacer layer being exposed in the recess. In some embodiments, the dielectric layer also covers the exposed portion of the spacer layer.

In another exemplary aspect, the present disclosure is directed to a method. The method includes forming a first fin protruding from a first region of a substrate and a second fin protruding from a second region of the substrate, forming a dummy gate structure on the first and second fins, recessing the first and second fins in a source/drain region not covered by the dummy gate structure, depositing a first mask layer covering the second region, growing a first epitaxial layer covering a sidewall of the first fin facing the source/drain region, reshaping the first epitaxial layer to expose a portion of the sidewall of the first fin, removing the first mask layer, depositing a second mask layer covering the first region, growing a second epitaxial layer covering a sidewall of the second fin facing the source/drain region, the first and second epitaxial layers including different material compositions, reshaping the second epitaxial layer to expose a portion of the sidewall of the second fin, removing the second mask layer, depositing a dielectric layer over the first and second epitaxial layers, the dielectric layer covering the exposed portions of the sidewalls of the first and second fins, and replacing the dummy gate structure with a metal gate structure. In some embodiments, the reshaping of the first epitaxial layer increases an aspect ratio of the first epitaxial layer, and the reshaping of the second epitaxial layer increases an aspect ratio of the second epitaxial layer. In some embodiments, the reshaping of the first epitaxial layer and the reshaping of the second epitaxial layer are performed simultaneously. In some embodiments, the method further includes growing a first buffer epitaxial layer directly under the first epitaxial layer, the first buffer epitaxial layer being below the exposed portion of the sidewall of the first fin, and growing a second buffer epitaxial layer directly under the second epitaxial layer, the second buffer epitaxial layer being below the exposed portion of the sidewall of the second fin. In some embodiments, during the reshaping of the first epitaxial layer, the first buffer epitaxial layer remains intact, and during the reshaping of the second epitaxial layer, the second buffer epitaxial layer remains intact. In some embodiments, the reshaping of the first epitaxial layer partially exposes a top surface of the first buffer epitaxial layer, and wherein the reshaping of the second epitaxial layer exposes a top surface of the second epitaxial layer. In some embodiments, the growing of the first buffer epitaxial layer and the growing of the second buffer epitaxial layer are performed simultaneously.

In yet another exemplary aspect, the present disclosure is directed to a semiconductor device. The semiconductor device includes a plurality of channel layers vertically stacked above a substrate, a conductive structure wrapping around each of the channel layers, an epitaxial feature abutting each of the channel layers, a height of the epitaxial feature being larger than a width of the epitaxial feature, and a dielectric layer covering the epitaxial feature, the dielectric layer being in physical contact with at least a portion of a topmost channel layer. In some embodiments, the semiconductor device further includes an isolation layer interposing the epitaxial feature and the conductive structure, the isolation layer being stacked between adjacent channel layers, and the dielectric layer being in physical contact with at least a top portion of the isolation layer. In some embodiments, the topmost channel layer has a width larger than that of the epitaxial feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a semiconductor fin protruding from a substrate;

depositing an isolation feature on sidewalls of the semiconductor fin;

forming a dummy gate structure across the semiconductor fin;

recessing the semiconductor fin in a region adjacent the dummy gate structure to form a recess, wherein an end of the semiconductor fin under the dummy gate structure is exposed in the recess;

growing an epitaxial feature in the recess and in physical contact with the isolation feature, wherein the epitaxial feature covers the end of the semiconductor fin from being exposed in the recess, wherein after the growing of the epitaxial feature the epitaxial feature includes a first crystalline surface and a second crystalline surface below the first crystalline surface;

trimming the epitaxial feature to reduce a width of the epitaxial feature, such that a portion of the end of the semiconductor fin is exposed again in the recess, wherein a height of the epitaxial feature is larger than the reduced width of the epitaxial feature, wherein the trimming of the epitaxial feature reduces a size of the first crystalline surface and replaces the second crystalline surface with a non-crystalline surface;

depositing a dielectric layer on the epitaxial feature, wherein the dielectric layer is in physical contact with the exposed portion of the end of the semiconductor fin; and replacing the dummy gate structure with a metal gate structure.

2. The method of claim 1, wherein the trimming of the epitaxial feature also reduces the height of the epitaxial feature.

3. The method of claim 2, wherein the epitaxial feature with the reduced height is still above a topmost portion of the semiconductor fin.

4. The method of claim 1, wherein the portion of the end of the semiconductor fin is a top portion of the semiconductor fin, and wherein after the trimming of the epitaxial feature, a bottom portion of the semiconductor fin remains fully covered by the epitaxial feature.

5. The method of claim 1, wherein the growing of the epitaxial feature includes:

growing a first epitaxial layer in the recess; and growing a second epitaxial layer on the first epitaxial layer, wherein the second epitaxial layer fully covers a top surface of the first epitaxial layer.

6. The method of claim 5, wherein the trimming of the epitaxial feature exposes a portion of the top surface of the first epitaxial layer.

7. The method of claim 1, further comprising:

forming a spacer layer interposing the epitaxial feature and the dummy gate structure, wherein after the trimming of the epitaxial feature, a portion of the spacer layer is exposed in the recess.

8. The method of claim 7, wherein the dielectric layer also covers the exposed portion of the spacer layer.

9. The method of claim 1, wherein the trimming of the epitaxial feature recesses a top surface of the epitaxial feature.

10. A method, comprising:

forming a first fin protruding from a first region of a substrate and a second fin protruding from a second region of the substrate;

forming a dummy gate structure on the first and second fins;

recessing the first and second fins in a source/drain region not covered by the dummy gate structure;

depositing a first mask layer covering the second region;

growing a first buffer epitaxial layer;

growing a first epitaxial layer covering a sidewall of the first fin facing the source/drain region, wherein the first buffer epitaxial layer is directly under the first epitaxial layer;

reshaping the first epitaxial layer to expose a portion of the sidewall of the first fin, wherein the first buffer epitaxial layer is below the exposed portion of the sidewall of the first fin, wherein during the reshaping of the first epitaxial layer, the first buffer epitaxial layer remains intact;

removing the first mask layer;

depositing a second mask layer covering the first region;

growing a second buffer epitaxial layer;

growing a second epitaxial layer covering a sidewall of the second fin facing the source/drain region, wherein the second buffer epitaxial layer is directly under the second epitaxial layer, wherein the first and second epitaxial layers include different material compositions;

reshaping the second epitaxial layer to expose a portion of the sidewall of the second fin, wherein the second buffer epitaxial layer is below the exposed portion of the sidewall of the second fin, wherein during the reshaping of the second epitaxial layer, the second buffer epitaxial layer remains intact;

removing the second mask layer;

depositing a dielectric layer over the first and second epitaxial layers, wherein the dielectric layer covers the exposed portions of the sidewalls of the first and second fins; and replacing the dummy gate structure with a metal gate structure.

11. The method of claim 10, wherein the reshaping of the first epitaxial layer increases an aspect ratio of the first epitaxial layer, and wherein the reshaping of the second epitaxial layer increases an aspect ratio of the second epitaxial layer.

12. The method of claim 10, wherein the reshaping of the first epitaxial layer and the reshaping of the second epitaxial layer are performed simultaneously.

13. The method of claim 10, wherein the reshaping of the first epitaxial layer partially exposes a top surface of the first buffer epitaxial layer, and wherein the reshaping of the second epitaxial layer exposes a top surface of the second epitaxial layer.

14. The method of claim 10, wherein the growing of the first buffer epitaxial layer and the growing of the second buffer epitaxial layer are performed simultaneously.

15. The method of claim 10, wherein the reshaping of the first and second epitaxial layers recesses top surfaces of the first and second epitaxial layers.

16. A method, comprising:

forming a fin-shaped structure protruding from a substrate;

depositing an isolation feature on sidewalls of the fin-shaped structure;

forming a dummy gate structure across the fin-shaped structure;

depositing a gate spacer on a sidewall of the dummy gate structure;

recessing the fin-shaped structure in a region adjacent the gate spacer to form a recess, wherein the recess exposes a sidewall the fin-shaped structure under the gate spacer;

growing a buffer epitaxial layer in the recess;

growing an epitaxial feature in the recess and over the buffer epitaxial layer, the epitaxial feature covering the sidewall of the fin-shaped structure from being exposed;

trimming the epitaxial feature to reduce a width of the epitaxial feature to expose a portion of the sidewall of the fin-shaped structure, wherein a height of the epitaxial feature is larger than the reduced width of the epitaxial feature, wherein during the trimming of the epitaxial feature the buffer epitaxial layer remains intact;

depositing an etch stop layer on the epitaxial feature, wherein the etch stop layer interfaces with the exposed portion of the sidewall of the fin-shaped structure; and replacing the dummy gate structure with a metal gate structure.

17. The method of claim 16, wherein the fin-shaped structure incudes a plurality of channel layers interleaved by a plurality of sacrificial layers, the method further comprising:

laterally recessing the sacrificial layers;

forming inner spacers abutting the sacrificial layers; and removing the sacrificial layers to release the channel layers, wherein the metal gate structure wraps around at least one of the channel layers, and wherein the etch stop layer interfaces with at least a topmost one of the inner spacers.

18. The method of claim 16, wherein prior to the trimming the epitaxial feature includes a crystalline facet, and wherein the trimming reduces a size of the crystalline facet.

19. The method of claim 16, wherein prior to the trimming the epitaxial feature includes a crystalline facet, and wherein the trimming replaces the crystalline facet with a non-crystalline surface.

20. The method of claim 16, wherein the fin-shaped structure includes a plurality of channel layers interleaved by a plurality of sacrificial layers, the method further comprising:

removing the sacrificial layers to release the channel layers, wherein the metal gate structure wraps around at least one of the channel layers, wherein the exposed portion of the sidewall of the fin-shaped structure includes a sidewall of a topmost one of the channel layer, and wherein the etch stop layer interfaces with the exposed sidewall of the topmost one of the channel layers.

* * * * *